United States Patent
Yamada et al.

(10) Patent No.: US 9,070,841 B2
(45) Date of Patent: Jun. 30, 2015

(54) SEMICONDUCTOR LIGHT EMITTING DEVICE AND METHOD FOR MANUFACTURING SAME

(71) Applicant: Kabushiki Kaisha Toshiba, Tokyo (JP)

(72) Inventors: Shinji Yamada, Kanagawa-ken (JP); Hiroshi Katsuno, Tokyo (JP); Satoshi Mitsugi, Kanagawa-ken (JP); Shinya Nunoue, Chiba-ken (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 13/780,678

(22) Filed: Feb. 28, 2013

(65) Prior Publication Data

US 2014/0138722 A1  May 22, 2014

(30) Foreign Application Priority Data

Nov. 22, 2012 (JP) .................................. 2012-256725

(51) Int. Cl.
*H01L 33/00* (2010.01)
*H01L 33/50* (2010.01)
(Continued)

(52) U.S. Cl.
CPC .............. *H01L 33/50* (2013.01); *H01L 33/647* (2013.01); *H01L 2933/0075* (2013.01); *H01L 33/36* (2013.01); *H01L 2924/0002* (2013.01)

(58) Field of Classification Search
CPC ......... H01L 33/20; H01L 33/36; H01L 33/50; H01L 33/60; H01L 33/64; H01L 33/642; H01L 33/644
USPC .......... 257/79, 98, E33.001, E33.06, E33.061
See application file for complete search history.

(56) References Cited

U.S. PATENT DOCUMENTS

| 7,511,311 | B2 * | 3/2009 | Kususe et al. .................. 257/95 |
| 2007/0120129 | A1 * | 5/2007 | DenBaars et al. ............. 257/79 |

(Continued)

FOREIGN PATENT DOCUMENTS

| JP | 2008-130721 | 6/2008 |
| JP | 2008130721 A * | 6/2008 |

(Continued)

OTHER PUBLICATIONS

U.S. Appl. No. 13/601,231, filed Aug. 31, 2012, Taisuke Sato, et al.
(Continued)

*Primary Examiner* — Meiya Li
*Assistant Examiner* — Peter M Albrecht
(74) *Attorney, Agent, or Firm* — Oblon, McClelland, Maier & Neustadt, L.L.P.

(57) ABSTRACT

According to one embodiment, a semiconductor light emitting device includes: a stacked body, a wavelength conversion layer, a first metal layer, and a first insulating section. The stacked body includes: a first and a second semiconductor layers; and a first light emitting layer provided between the first and the second semiconductor layers. The wavelength conversion layer is configured to convert wavelength of light emitted from the first light emitting layer. The first semiconductor layer is placed between the first light emitting layer and the wavelength conversion layer. The first metal layer is electrically connected to the second semiconductor layer. The first insulating section is provided between a first side surface and a first side surface portion of the first metal layer and between the wavelength conversion layer and the first side surface portion.

21 Claims, 16 Drawing Sheets

(51) Int. Cl.
*H01L 33/64* (2010.01)
*H01L 33/36* (2010.01)

(56) References Cited

U.S. PATENT DOCUMENTS

| | | | | |
|---|---|---|---|---|
| 2010/0078670 | A1* | 4/2010 | Kim et al. | 257/98 |
| 2011/0220935 | A1 | 9/2011 | Gotoda et al. | |
| 2012/0049229 | A1* | 3/2012 | Lim et al. | 257/98 |
| 2012/0235168 | A1* | 9/2012 | Katsuno et al. | 257/88 |

FOREIGN PATENT DOCUMENTS

| | | |
|---|---|---|
| JP | 2008-205005 | 9/2008 |
| JP | 4211329 | 1/2009 |
| JP | 4211329 B2 | 1/2009 |
| JP | 2012-195321 | 10/2012 |
| JP | 2012-195345 | 10/2012 |
| JP | 2012-244165 | 12/2012 |

OTHER PUBLICATIONS

Notification of Reason(s) for Refusal issued Apr. 19, 2013 in Japanese Patent Application No. 2012-256725 (with English translation).

U.S. Appl. No. 14/175,107, filed Feb. 7, 2014, Yamada, et al.

Office Action issued Aug. 22, 2014 in Korean Patent Application No. 10-2013-0104697 (with English translation).

* cited by examiner

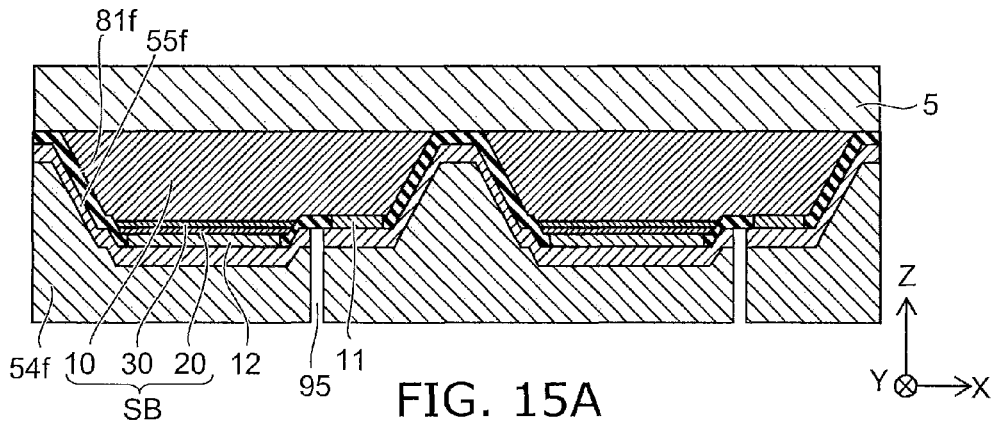
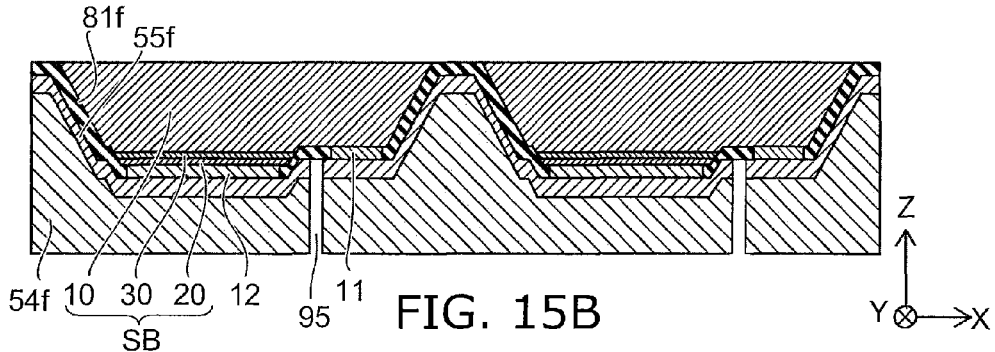
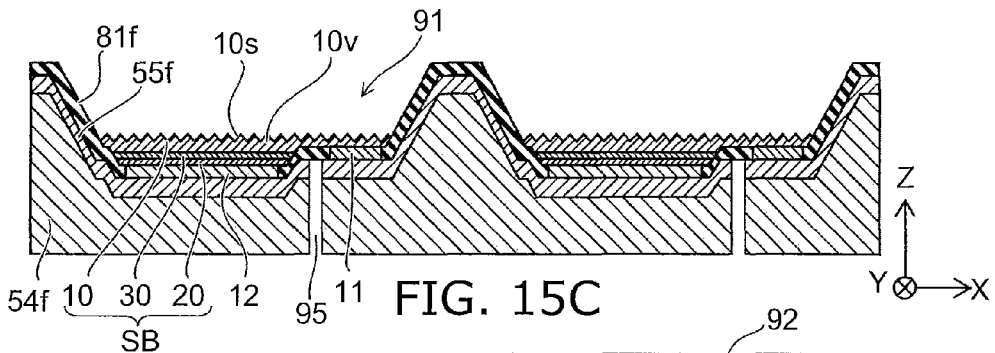
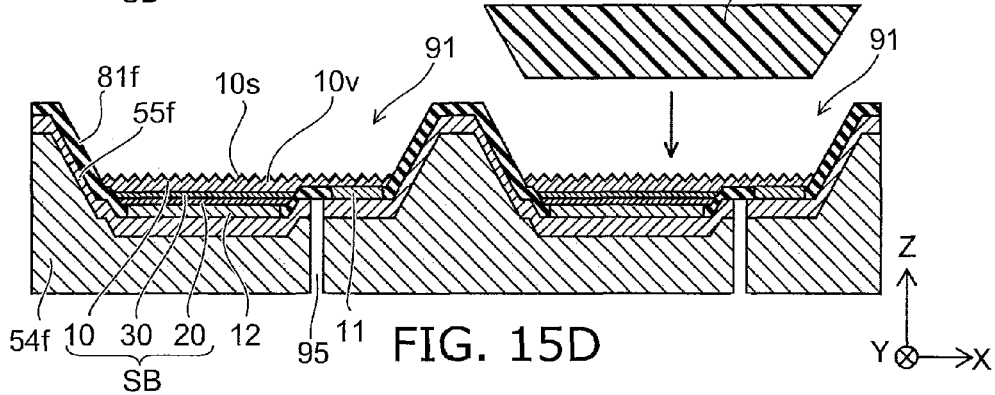
FIG. 15A
FIG. 15B
FIG. 15C
FIG. 15D

US 9,070,841 B2

SEMICONDUCTOR LIGHT EMITTING DEVICE AND METHOD FOR MANUFACTURING SAME

CROSS-REFERENCE TO RELATED APPLICATIONS

This application is based upon and claims the benefit of priority from the prior Japanese Patent Application No. 2012-256725, filed on Nov. 22, 2012; the entire contents of which are incorporated herein by reference.

FIELD

Embodiments described herein relate generally to a semiconductor light emitting device and method for manufacturing same.

BACKGROUND

Semiconductor light emitting devices such as light emitting diodes and laser diodes are known. In semiconductor light emitting devices, improvement of heat dissipation is desired. For instance, due to heat generation, the resistance of the semiconductor crystal around the electrode may be decreased and locally form a path where the current easily flows. In this case, for instance, the decrease of light emission uniformity and the crystal degradation are more likely to occur. Furthermore, in a semiconductor light emitting device including a wavelength conversion layer made of e.g. phosphor, the temperature increase of the wavelength conversion layer may change the characteristics of the wavelength conversion layer.

BRIEF DESCRIPTION OF THE DRAWINGS

FIGS. 13A to 13D, 14A to 14E, and 15A to 15D are schematic sectional views showing the method for manufacturing a semiconductor light emitting device according to the second embodiment.

DETAILED DESCRIPTION

Figure 1A:
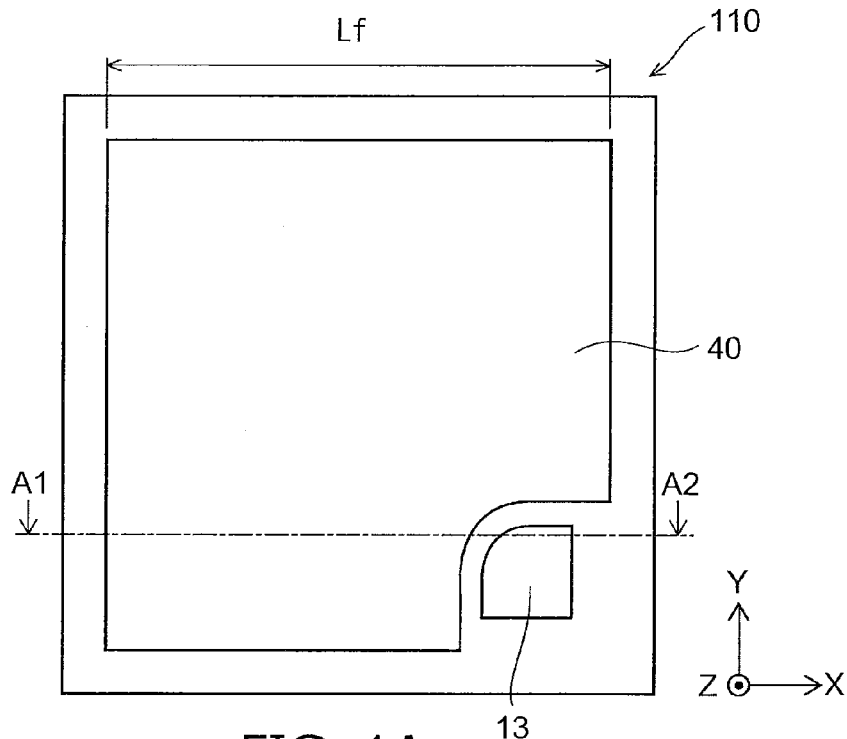
FIGS. 1A and 1B are schematic views showing a semiconductor light emitting device according to a first embodiment.

In general, according to one embodiment, a semiconductor light emitting device includes: a stacked body including: a first semiconductor layer of a first conductivity type; a second semiconductor layer of a second conductivity type spaced from the first semiconductor layer in a first direction; and a first light emitting layer provided between the first semiconductor layer and the second semiconductor layer, the first semiconductor layer having a first side surface non-parallel to a plane perpendicular to the first direction; a wavelength conversion layer configured to convert wavelength of light emitted from the first light emitting layer, the first semiconductor layer being placed between the first light emitting layer and the wavelength conversion layer; a first metal layer including: a first side surface portion opposed to at least part of the wavelength conversion layer, and the first side surface; and a first bottom surface portion opposed to the second semiconductor layer, the first metal layer being electrically connected to the second semiconductor layer; and a first insulating section provided between the first side surface and the first side surface portion and between the wavelength conversion layer and the first side surface portion, and electrically insulating between the first semiconductor layer and the first metal layer.

In general, according to another embodiment, a method for manufacturing a semiconductor light emitting device is provided. The method includes: preparing a workpiece including: a substrate; and a stacked film stacked on the substrate in a first direction and including: a first semiconductor film of a first conductivity type; a second semiconductor film of a second conductivity type, the first semiconductor film being placed between the substrate and the second semiconductor film; and a light emitting film provided between the first semiconductor film and the second semiconductor film; forming in the workpiece a trench exposing a first side surface non-parallel to a plane perpendicular to the first direction of the first semiconductor film by removing part of the second semiconductor film, part of the light emitting film, and part of the first semiconductor film; forming an insulating film on the workpiece provided with the trench; forming on the insulating film a metal film including a bottom surface portion opposed to the second semiconductor film and a side surface portion opposed to the first side surface by depositing a metal material on the insulating film to fill the trench with the metal material; removing the substrate to expose a stacked body including: a first semiconductor layer formed from the first semiconductor film and having the first side surface; a light emitting layer formed from the light emitting film; and a second semiconductor layer formed from the second semiconductor film; and forming on the stacked body a wavelength conversion layer, at least part of the wavelength conversion layer being opposed to the side surface portion.

Embodiments will now be described with reference to the drawings.

The drawings are schematic or conceptual. The relationship between the thickness and the width of each portion, and the size ratio between the portions, for instance, are not necessarily identical to those in reality. Furthermore, the same portion may be shown with different dimensions or ratios depending on the figures.

In the present specification and the drawings, components similar to those described previously with reference to earlier figures are labeled with like reference numerals, and the detailed description thereof is omitted appropriately.

(First Embodiment)

Figure 1B:
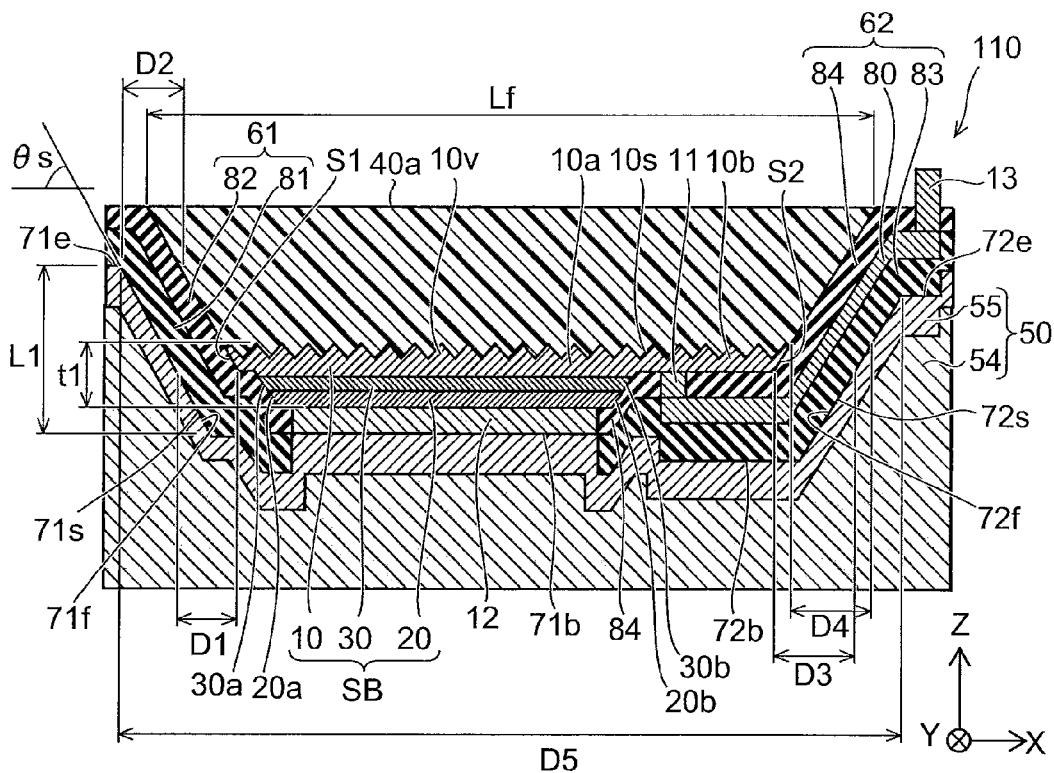

FIGS. 1A and 1B are schematic views showing a semiconductor light emitting device according to a first embodiment.

FIG. 1A is a schematic plan view. FIG. 1B is a schematic sectional view showing a cross section taken along line A1-A2 of FIG. 1A.

As shown in FIGS. 1A and 1B, the semiconductor light emitting device 110 according to this embodiment includes a stacked body SB, a wavelength conversion layer 40, a metal layer 50 (first metal layer), and a first insulating section 61. In FIG. 1B, for visual clarity of the configuration of each portion such as the stacked body SB, the dimension of each portion is changed from FIG. 1A for convenience.

The stacked body SB includes a first semiconductor layer 10, a second semiconductor layer 20, and a light emitting layer 30 (first light emitting layer). The first semiconductor layer 10 has a first side surface 51.

The first semiconductor layer 10 includes a nitride semiconductor and is of the first conductivity type. For instance, the first conductivity type is n-type, and the second conductivity type is p-type. Alternatively, the first conductivity type may be p-type, and the second conductivity type may be n-type. In the following description, it is assumed that the first conductivity type is n-type, and the second conductivity type is p-type. The first semiconductor layer 10 is e.g. a GaN layer containing n-type impurity. The n-type impurity is e.g. Si.

The second semiconductor layer 20 is spaced from the first semiconductor layer 10 in a first direction. In this example, the first direction is set to the Z-axis direction. The first direction is the direction perpendicular to the film surface of the first semiconductor layer 10. One direction perpendicular to the Z-axis direction is referred to as X-axis direction. The direction perpendicular to the Z-axis direction and the X-axis direction is referred to as Y-axis direction. The first side surface 51 is non-parallel to the plane (X-Y plane) perpendicular to the first direction.

The second semiconductor layer 20 includes a nitride semiconductor and is of the second conductivity type. The second semiconductor layer 20 is e.g. a GaN layer containing p-type impurity. The p-type impurity is e.g. Mg. The thickness of the second semiconductor layer 20 is e.g. thinner than the thickness of the first semiconductor layer 10. Alternatively, the thickness of the second semiconductor layer 20 may be more than or equal to the thickness of the first semiconductor layer 10.

The light emitting layer 30 is provided between the first semiconductor layer 10 and the second semiconductor layer 20. The Z-axis direction (first direction) corresponds to e.g. the stacking direction of the first semiconductor layer 10, the second semiconductor layer 20, and the light emitting layer 30.

The light emitting layer 30 includes e.g. a nitride semiconductor. The light emitting layer 30 includes e.g. a plurality of barrier layers and well layers provided between the plurality of barrier layers. The barrier layers and the well layers are stacked along the Z-axis direction. The light emitting layer 30 is based on e.g. an MQW (multi-quantum well) structure. Alternatively, the light emitting layer 30 may be based on an SQW (single-quantum well) structure. The barrier layer is e.g. a GaN layer. The well layer is e.g. an InGaN layer.

A voltage is applied between the first semiconductor layer 10 and the second semiconductor layer 20 to pass a current in the light emitting layer 30. Thus, light is emitted from the light emitting layer 30.

The wavelength conversion layer 40 converts the wavelength of light emitted from the light emitting layer 30. The wavelength conversion layer 40 e.g. absorbs at least part of first light emitted from the light emitting layer 30, and emits second light of a peak wavelength different from the peak wavelength of the first light. That is, the wavelength conversion layer 40 converts the peak wavelength of the light emitted from the light emitting layer 30. The wavelength conversion layer 40 may emit e.g. light of a plurality of peak wavelengths different from the peak wavelength of the first light. The wavelength conversion layer 40 is e.g. a phosphor layer. The wavelength conversion layer 40 may be e.g. a stacked body of a plurality of phosphor layers different in the peak wavelength of the light emitted therefrom. The wavelength conversion layer 40 is made of e.g. phosphor-containing ceramic or phosphor-containing transparent resin.

The emission light of the light emitting layer 30 is e.g. red light, yellow light, green light, blue light, violet light, or ultraviolet light. The light emitted from the wavelength conversion layer 40 is e.g. red light, yellow light, green light, blue light, violet light, or ultraviolet light. The combined light of the light emitted from the wavelength conversion layer 40 and the emission light is e.g. substantially white light. Alternatively, the combined light may be e.g. red light, yellow light, green light, blue light, violet light, or ultraviolet light. The peak wavelength of the combined light may be e.g. an arbitrary wavelength between the infrared region and the ultraviolet region.

At least part of the wavelength conversion layer 40 is in contact with e.g. the first semiconductor layer 10. In this example, the surface 10s of the first semiconductor layer 10 opposed to the wavelength conversion layer 40 constitutes a light extraction surface. The surface 10s is provided with unevenness 10v. The surface 10s is roughened. This suppresses total reflection at the surface 10s of the light emitted from the light emitting layer 30, and can increase the light extraction efficiency.

The metal layer 50 includes a first side surface portion 71s and a first bottom surface portion 71b. The first side surface portion 71s is opposed to at least part of the wavelength conversion layer 40, and the first side surface S1. The first bottom surface portion 71b is opposed to the second semiconductor layer 20. The metal layer 50 is electrically connected to e.g. the second semiconductor layer 20. The absolute value of the difference between the length L1 along the Z-axis direction of the first side surface portion 71s and the thickness t1 (length along the Z-axis direction) of the stacked body SB is e.g. 0.1 μm or more and 1000 μm or less. The absolute value of the difference between the length L1 and the thickness t1 is preferably more than or equal to e.g. the grain diameter of the phosphor included in the wavelength conversion layer 40.

In this embodiment, the wavelength conversion layer 40 is provided in a recess formed from the first insulating section 61 (e.g., first insulating layer 81 and second insulating layer 82) and the surface 10s of the first semiconductor layer 10. The wavelength conversion layer 40 may fill e.g. the entirety of the recess. In this case, the thickness of the wavelength conversion layer 40 is substantially equal to the depth of the recess. The wavelength conversion layer 40 may fill e.g. part of the recess. In this case, the thickness of the wavelength conversion layer 40 is thinner than the depth of the recess. The wavelength conversion layer 40 may include e.g. a portion outside the recess. In this case, the thickness of the wavelength conversion layer 40 is thicker than the depth of the recess.

The distance D1 between the first side surface S1 and the first side surface portion 71s is preferably less than or equal to e.g. the thickness t1 in the Z-axis direction of the stacked body SB. This provides e.g. good heat dissipation. Furthermore, the distance D2 between the wavelength conversion layer 40 and the first side surface portion 71s is preferably less than or equal to e.g. the thickness t1 in the Z-axis direction of the stacked body SB. The distance D1 and the distance D2 are e.g. a distance in a direction perpendicular to the Z-axis direction. In this example, they are e.g. the distance in the X-axis direction. Alternatively, the distance D1 and the distance D2 may be e.g. a distance in the direction perpendicular to the surface of the first side surface portion 71s. The distance D1 and the distance D2 are e.g. 10 μm or less. More preferably, the distance D1 and the distance D2 are e.g. 1 μm or less. This can provide e.g. good heat dissipation. Moreover, for instance, this can suppress cracking of the first insulating section 61 provided between the first side surface S1 and the first side surface portion 71s. Furthermore, the distance D1 and the distance D2 are e.g. 0.1 μm or more. This provides good insulation.

The metal layer 50 includes e.g. a first layer 54 and a second layer 55. The first layer 54 is made of e.g. at least one of Ti, W, Pt, Au, Cu, Ni, Ag, Co, Sn, Pd, and Al. The first layer 54 is made of e.g. an alloy including at least one of Ti, W, Pt, Au, Cu, Ni, Ag, Co, Sn, Pd, and Al. The first layer 54 functions as e.g. a support metal member for supporting the stacked body SB and the like. The thickness (length along the Z-axis direction) of the first layer 54 is e.g. 10 μm or more and 1000 μm or less. The surface (bottom surface) of the first layer 54 on the opposite side from the second layer 55 is planarized by e.g. grinding processing. This can form a bottom surface facilitating mounting. For instance, the first layer 54 is made of a material having high thermal conductivity such as Cu and Ni. This can improve e.g. heat dissipation of the stacked body SB (crystal layer).

The second layer 55 is provided e.g. between the stacked body SB and the first layer 54. The second layer 55 is made of e.g. at least one of Ti, W, Pt, Au, Cu, Ni, Ag, Co, Sn, Pd, and Al. The second layer 55 is made of e.g. an alloy including at least one of Ti, W, Pt, Au, Cu, Ni, Ag, Co, Sn, Pd, and Al. For instance, the second layer 55 is made of a metal having high reflectance such as Ag. This can facilitate reflection of light at the first side surface portion 71s and further increase the light extraction efficiency. The second layer 55 functions as an adhesive metal layer for enhancing adhesiveness between the first layer 54 and the first insulating section 61 and the like. The metal layer 50 may be a layer made of one metal material, or a layer made of three or more metal materials.

The metal layer 50 further includes a first end portion 71e. In this example, the first side surface portion 71s is placed between the first bottom surface portion 71b and the first end portion 71e. The first end portion 71e is spaced from the first bottom surface portion 71b as projected on the plane (X-Y plane) perpendicular to the Z-axis direction. The first side surface portion 71s has a first opposed surface 71f opposed to the first side surface 51. The first opposed surface 71f is inclined with respect to the Z-axis direction. The angle θs between the opposed surface 71f and the X-Y plane is e.g. 10° or more and 60° or less. This can e.g. increase the light extraction efficiency. A more preferable range of the angle θs is e.g. 40° or more and 50° or less. This can e.g. further increase the light extraction efficiency. For instance, the second layer 55 is made of a metal having high reflectance such as Ag. This can facilitate reflection of light at the first side surface portion 71s and further increase the light extraction efficiency.

The first insulating section 61 is provided between the first side surface S1 and the first side surface portion 71s and between the wavelength conversion layer 40 and the first side surface portion 71s. The first insulating section 61 electrically insulates between the first semiconductor layer 10 and the metal layer 50. The first insulating section 61 covers e.g. the first side surface S1. The first insulating section 61 covers the side surface of the wavelength conversion layer 40. In this example, the first insulating section 61 includes a first insulating layer 81 and a second insulating layer 82. The first insulating layer 81 and the second insulating layer 82 are made of e.g. dielectric. The first insulating layer 81 and the second insulating layer 82 are e.g. dielectric films. The dielectric film is e.g. an oxide film or nitride film. The oxide film is e.g. silicon oxide film (e.g., $SiO_2$). The first insulating layer 81 and the second insulating layer 82 are formed by e.g. CVD technique or sputtering technique.

In this example, the first insulating section 61 extends between at least part of the wavelength conversion layer 40 and the first side surface portion 71s. Thus, the first insulating section 61 is provided between the first side surface S1 and the first side surface portion 71s and between the wavelength conversion layer 40 and the first side surface portion 71s. The first insulating section 61 is in contact with e.g. the metal layer 50, the first side surface S1, and the wavelength conversion layer 40. Thus, for instance, the heat generated in the stacked body SB and the wavelength conversion layer 40 can be easily released to the metal layer 50. The first insulating section 61 does not necessarily need to be provided between the wavelength conversion layer 40 and the metal layer 50. For instance, the wavelength conversion layer 40 may be in direct contact with the metal layer 50. This can e.g. further improve the heat dissipation. In the case where the first insulating section 61 is provided between the wavelength conversion layer 40 and the metal layer 50, for instance, the process for manufacturing the semiconductor light emitting device 110 can be simplified.

The second semiconductor layer 20 has a side surface 20a. The light emitting layer 30 has a side surface 30a. The side surface 20a and the side surface 30a are non-parallel to the X-Y plane. The side surface 30a is continuous with the first side surface S1 and the side surface 20a. The first insulating section 61 extends also between the side surface 30a and the metal layer 50 and between the side surface 20a and the metal layer 50. The first insulating section 61 electrically insulates e.g. between the light emitting layer 30 and the metal layer 50.

In this example, the semiconductor light emitting device 110 further includes a first electrode 11 and a second insulating section 62.

The first semiconductor layer 10 has a first portion 10a opposed to the light emitting layer 30, and a second portion 10b juxtaposed with the first portion 10a in a second direction non-parallel to the Z-axis direction and not opposed to the light emitting layer 30. The second portion 10b has a second side surface S2 non-parallel to the X-Y plane. The second direction may be an arbitrary direction non-parallel to the Z-axis direction.

The metal layer 50 further includes a second side surface portion 72s and a second bottom surface portion 72b. The second side surface portion 72s is opposed to at least part of the wavelength conversion layer 40, and the second side surface S2. The second bottom surface portion 72b is opposed to the second portion 10b and is continuous with the first bottom surface portion 71b.

The distance D3 between the second side surface S2 and the second side surface portion 72s is preferably less than or equal to e.g. the thickness t1 in the Z-axis direction of the stacked body SB. This provides e.g. good heat dissipation. Furthermore, the distance D4 between the wavelength conversion layer 40 and the second side surface portion 72s is preferably less than or equal to e.g. the thickness t1 in the Z-axis direction of the stacked body SB. The distance D3 and the distance D4 are e.g. a distance in a direction perpendicular to the Z-axis direction. In this example, they are e.g. the distance in the X-axis direction. Alternatively, the distance D3 and the distance D4 may be e.g. a distance in the direction perpendicular to the surface of the second side surface portion 72s. The distance D3 and the distance D4 are e.g. 10 µm or less. More preferably, the distance D3 and the distance D4 are e.g. 2 µm or less. This can e.g. further improve the heat dissipation. Furthermore, the distance D3 and the distance D4 are e.g. 0.1 µm or more. This provides good insulation.

The first electrode 11 is provided between the second portion 10b and the second bottom surface portion 72b, and electrically connected to the first semiconductor layer 10. The first electrode 11 is in contact with e.g. the second portion 10b.

The first electrode 11 is e.g. reflective to the light emitted from the light emitting layer 30. The first electrode 11 includes e.g. at least one of Ti, Pt, Al, Ag, Ni, Au, and Ta. The first electrode 11 is made of e.g. an alloy including at least one of Ti, Pt, Al, Ag, Ni, Au, and Ta. More preferably, the first electrode 11 includes at least one of Al and Ag. Thus, for instance, the first electrode 11 can be provided with good reflectivity to the light emitted from the light emitting layer 30, and the light extraction efficiency can be improved. The thickness of the first electrode 11 is e.g. 10 nm or more and 10 µm or less. More preferably, in view of the film thickness needed as a reflective film estimated from the plasma frequency and the reduction of operating voltage, the thickness of the first electrode 11 is 100 nm or more and 1 µm or less.

The second insulating section 62 is provided between the second side surface S2 and the second side surface portion 72s and between the wavelength conversion layer 40 and the second side surface portion 72s. The second insulating section 62 electrically insulates between the first semiconductor layer 10 and the metal layer 50. The second insulating section 62 covers e.g. the second side surface S2. The second insulating section 62 covers e.g. the side surface of the wavelength conversion layer 40. The second insulating section 62 is in contact with e.g. the metal layer 50, the second side surface S2, and the wavelength conversion layer 40. The second insulating section 62 does not necessarily need to be provided between the wavelength conversion layer 40 and the metal layer 50.

The second insulating section 62 includes a third insulating layer 83 (insulating layer), a fourth insulating layer 84, and a wiring layer 80. The wiring layer 80 is electrically connected to the first electrode 11. The third insulating layer 83 is provided between the wiring layer 80 and the metal layer 50, and electrically insulates between the wiring layer 80 and the metal layer 50. The fourth insulating layer 84 is provided e.g. between the first semiconductor layer 10 and the wiring layer 80 and between the wavelength conversion layer 40 and the wiring layer 80. In this example, the light emitting layer 30 has a side surface 30b different from the side surface 30a. The second semiconductor layer 20 has a side surface 20b different from the side surface 20a. The fourth insulating layer 84 extends between the above side surface 30b of the light emitting layer 30 and the metal layer 50 and between the above side surface 20b of the second semiconductor layer 20 and the metal layer 50. Here, the first insulating layer 81 and the third insulating layer 83 may constitute one continuous layer. The second insulating layer 82 and the fourth insulating layer 84 may constitute one continuous layer.

The wiring layer 80 includes e.g. at least one of Ti, Pt, Al, Ag, Ni, Au, and Ta. The wiring layer 80 is made of e.g. an alloy including at least one of Ti, Pt, Al, Ag, Ni, Au, and Ta. More preferably, the wiring layer 80 includes at least one of Al and Ag. Thus, for instance, the wiring layer 80 can be provided with good reflectivity to the light emitted from the light emitting layer 30, and the light extraction efficiency can be improved. The thickness of the wiring layer 80 is e.g. 10 nm or more and 10 µm or less. More preferably, in view of suppression of step discontinuity and covering with the third insulating layer 83, the thickness of the wiring layer 80 is 600 nm or more and 1 µm or less.

In this example, the semiconductor light emitting device 110 further includes a third electrode 13.

The metal layer 50 further includes a second end portion 72e. In this example, the second side surface portion 72s is placed between the second bottom surface portion 72b and the second end portion 72e. The third electrode 13 is opposed to the second end portion 72e in the Z-axis direction. The second insulating section 62 extends between the second end portion 72e and the third electrode 13. The wiring layer 80 is electrically connected to the third electrode 13. Thus, the first electrode 11 is electrically connected to the third electrode 13 through the wiring layer 80. The third electrode 13 is e.g. a pad electrode used for external wiring. The third electrode 13 is made of e.g. a metal of at least one of Ti, Pt, and Au, or an alloy including at least one of these metals.

The second end portion 72e is spaced from the second bottom surface portion 72b as projected on the X-Y plane. The second side surface portion 72s has a second opposed surface 72f opposed to the second side surface S2. The second opposed surface 72f is inclined with respect to the Z-axis direction. The first side surface portion 71s is e.g. continuous with the second side surface portion 72s. The first side surface portion 71s and the second side surface portion 72s surround the stacked body SB centered on e.g. the Z-axis direction.

The length Lf along a direction (e.g., X-axis direction) perpendicular to the Z-axis direction of the wavelength conversion layer 40 is e.g. less than or equal to the distance D5 along the X-axis direction between the first side surface portion 71s and the second side surface portion 72s. For instance, preferably, the angle of the inclined surface of the second insulating layer 82 and the angle of the inclined surface of the fourth insulating layer 84 are substantially equal to e.g. the angle of the inclined surface of the wavelength conversion layer 40. Preferably, the area of the roughened region of the first semiconductor layer 10 is substantially equal to the area of the region of the wavelength conversion layer 40 in contact with the first semiconductor layer 10. At least the angle of the inclined surface of the wavelength conversion layer 40 is made steeper than the angle of the inclined surface of the second insulating layer 82 and the angle of the inclined surface of the fourth insulating layer 84. The area of the region of the wavelength conversion layer 40 in contact with the first semiconductor layer 10 is made smaller than the area of the roughened region of the first semiconductor layer 10. In this case, the wavelength conversion layer 40 can be in contact with the roughened first semiconductor layer 10.

The length Lf of the wavelength conversion layer 40 is e.g. 50% or more of the distance D5. More preferably, the length Lf of the wavelength conversion layer 40 is e.g. 75% or more of the distance D5. This can make the emission light of the light emitting layer 30 incident on the wavelength conversion layer 40. More preferably, the length Lf of the wavelength conversion layer 40 is e.g. substantially equal to the distance D5. This can make the emission light of the light emitting layer 30 incident on the wavelength conversion layer 40 more appropriately. Here, the length Lf is e.g. the longest of the lengths along the X-axis direction of the wavelength conversion layer 40. In this example, the length Lf is e.g. the length in the X-axis direction of the surface 40a facing the opposite side of the wavelength conversion layer 40 from the first semiconductor layer 10. The distance D5 is e.g. the longest of the distances along the X-axis direction between the first side surface portion 71s and the second side surface portion 72s.

The semiconductor light emitting device 110 further includes a second electrode 12. The second electrode 12 is provided between the second semiconductor layer 20 and the first bottom surface portion 71b, and electrically connected to the second semiconductor layer 20 and the metal layer 50. In this example, the second electrode 12 is in contact with the second semiconductor layer 20 and the first bottom surface portion 71b. The second electrode 12 is e.g. reflective to the light emitted from the light emitting layer 30. The second electrode 12 includes e.g. Ag. The second electrode 12 is made of e.g. at least one of Ag and Ag alloy. Thus, for instance, the second electrode 12 has good reflectivity. The thickness of the second electrode 12 is e.g. 10 nm or more and 10 μm or less. More preferably, in view of the film thickness needed as a reflective film estimated from the plasma frequency and the reduction of operating voltage, the thickness of the second electrode 12 is 100 nm or more and 1 μm or less.

Semiconductor light emitting devices such as LED are used in various products such as general lighting products and display backlights. For price reduction of these products, it is effective to reduce the number of LED chips installed in the product, to downsize the LED chip, and to increase the current injected into the LED chip. In downsizing the LED chip and increasing the current, improvement of the heat dissipation of the chip becomes a challenge. In the case of fabricating white LED, it is also important to suppress non-uniformity of color and to increase the yield of the chip.

In reducing the number of LED chips by downsizing the LED chip or increasing the current, the influence of heat generated inside the stacked body SB (crystal layer) is significant. For instance, due to heat generation, the resistance of the crystal layer around the electrode may be decreased and locally form a path where the current easily flows inside the crystal layer. In this case, the decrease of light emission uniformity and the degradation of the crystal layer are more likely to occur. Thus, heat dissipation from the crystal layer is important.

On the other hand, there is a configuration in which the wavelength of light emission emitted from the crystal layer is converted by a wavelength conversion layer made of e.g. phosphor to obtain a color different from the color (wavelength) of the light emission. Thus, for instance, white light is obtained. In such a configuration, due to the heat generated in the crystal layer, the temperature of the wavelength conversion layer is increased. The temperature increase of the wavelength conversion layer may change the wavelength conversion characteristics, and the desired characteristics may not be obtained. Furthermore, heat is generated also during wavelength conversion in the wavelength conversion layer. In the case where the thermal conductivity of the wavelength conversion layer is low, heat dissipation from the wavelength conversion layer is also important.

Thus, there is demand for a novel structure capable of improving the heat dissipation of the wavelength conversion layer as well as improving heat dissipation in the crystal layer.

In the semiconductor light emitting device 110 according to this embodiment, the heat dissipation of the crystal layer can be improved, and the heat dissipation of the wavelength conversion layer 40 can also be improved. In this embodiment, the metal layer 50 opposed to the bottom surface and the side surface of the stacked body SB is provided. Thus, the heat dissipation of the crystal layer can be improved. Furthermore, the metal layer 50 is opposed to the wavelength conversion layer 40. Thus, the heat dissipation of the wavelength conversion layer 40 can be improved. For instance, the device itself functions as a package having heat sink capability. In the semiconductor light emitting device 110 according to this embodiment, good heat dissipation can be obtained.

If the metal layer 50 is opposed to only the bottom surface and the side surface of the stacked body SB, heat can be dissipated from the crystal layer, but heat dissipation from the wavelength conversion layer 40 is difficult without the intermediary of the crystal layer.

Furthermore, in the configuration based on the wavelength conversion layer, the color may be made non-uniform. For instance, there exists light emitted out laterally (e.g., in a direction parallel to the X-Y plane) from the side surface of the crystal layer. The light emitted out from the major surface of the crystal layer and the light emitted out from the side surface are different in angle and distance when passing through the wavelength conversion layer. Thus, depending on the outgoing angle, for instance, the ratio of the light emission emitted from the crystal layer to the light converted by the wavelength conversion layer is different. Accordingly, the chromaticity changes with the outgoing angle. For instance, in the case where white light is emitted out from the semiconductor light emitting device, the chromaticity changes with the angle. That is, the color is made non-uniform.

In contrast, in the semiconductor light emitting device 110 according to this embodiment, the side surface of the crystal layer is covered with the metal layer 50. Thus, in the semiconductor light emitting device 110, occurrence of laterally extracted light can be suppressed by the metal layer 50. Furthermore, the light directed laterally from the side surface of the crystal layer can be reflected by the metal layer 50 and directed to the wavelength conversion layer 40. Thus, the light extraction efficiency can be increased. In this embodiment, the light emitted from the stacked body SB efficiently passes inside the wavelength conversion layer 40. Thus, in this embodiment, the change of chromaticity depending on the outgoing angle of light can be suppressed, and the uniformity of color can be improved.

An example of a method for manufacturing the semiconductor light emitting device 110 according to this embodiment is now described.

FIGS. 2A to 2D, 3A to 3D, 4A to 4D, and 5A to 5C are schematic sectional views showing the method for manufacturing a semiconductor light emitting device according to the first embodiment.

Figure 2A:
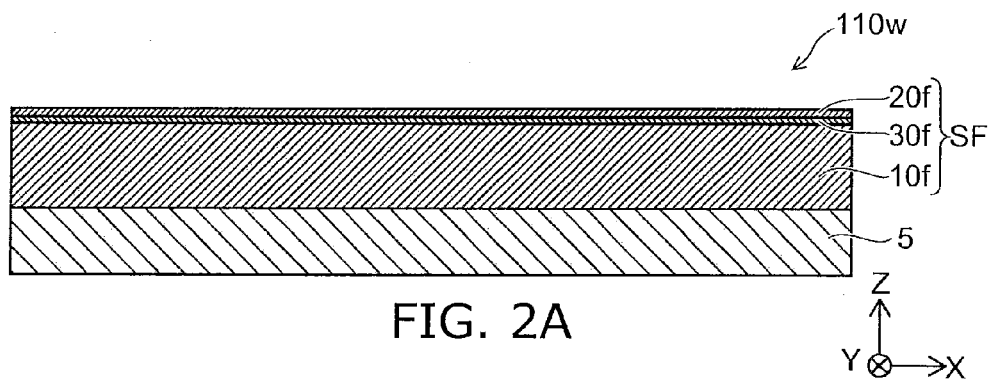
FIGS. 2A to 2D, 3A to 3D, 4A to 4D, and 5A to 5C are schematic sectional views showing the method for manufacturing a semiconductor light emitting device according to the first embodiment.

As shown in FIG. 2A, in manufacturing the semiconductor light emitting device 110, first, a workpiece 110w is prepared. The workpiece 110w includes a substrate 5 and a stacked film SF. The stacked film SF is stacked on the substrate 5 in the Z-axis direction. The stacked film SF includes a first semiconductor film 10f of the first conductivity type constituting a first semiconductor layer 10, a second semiconductor film 20f of the second conductivity type constituting a second semiconductor layer 20, and a light emitting film 30f constituting a light emitting layer 30.

In the workpiece 110w, the first semiconductor film 10f is placed between the substrate 5 and the second semiconductor film 20f. The light emitting film 30f is placed between the first semiconductor film 10f and the second semiconductor film 20f. The substrate 5 is e.g. a silicon substrate or sapphire substrate. In this example, the thickness of the first semiconductor film 10f is thicker than the first semiconductor layer 10.

The preparation of the workpiece 110w includes forming the workpiece 110w by e.g. forming a first semiconductor film 10f on the substrate 5, forming a light emitting film 30f on the first semiconductor film 10f, and forming a second semiconductor film 20f on the light emitting film 30f.

Figure 2B:
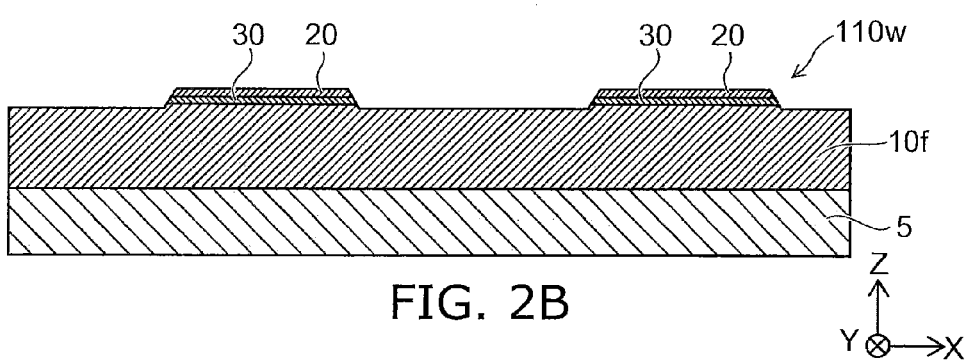

As shown in FIG. 2B, for instance, by photolithography processing and etching processing, part of the second semiconductor film 20f and part of the light emitting film 30f are removed. Thus, part of the first semiconductor film 10f is exposed. Furthermore, a second semiconductor layer 20 is formed from the second semiconductor film 20f, and a light emitting layer 30 is formed from the light emitting film 30f.

Figure 2C:
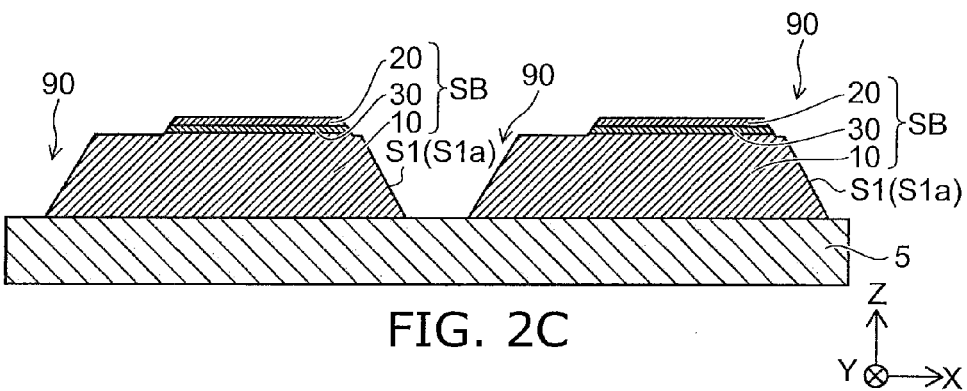

As shown in FIG. 2C, for instance, by photolithography processing and etching processing, part of the first semiconductor film 10f is removed to form a plurality of trenches 90 (device separation trenches). The trench 90 exposes a first side surface S1a of the first semiconductor film 10f. In this example, the plurality of trenches 90 expose part of the substrate 5. Thus, a first semiconductor layer 10 is formed from the first semiconductor film 10f. Furthermore, by the formation of the plurality of trenches 90, a plurality of stacked bodies SB are formed from the stacked film SF. Thus, in this example, the trench 90 exposes a first side surface S1 of the first semiconductor layer 10. The etching of the workpiece 110w is based on e.g. etching technique such as RIE. Here, the depth (distance in the Z-axis direction) of the trench 90 is made longer than the thickness t1 of the stacked body SB of the semiconductor light emitting device 110 to be manufactured. This makes it possible to form a metal layer 50 opposed to at least part of a wavelength conversion layer 40.

Figure 2D:
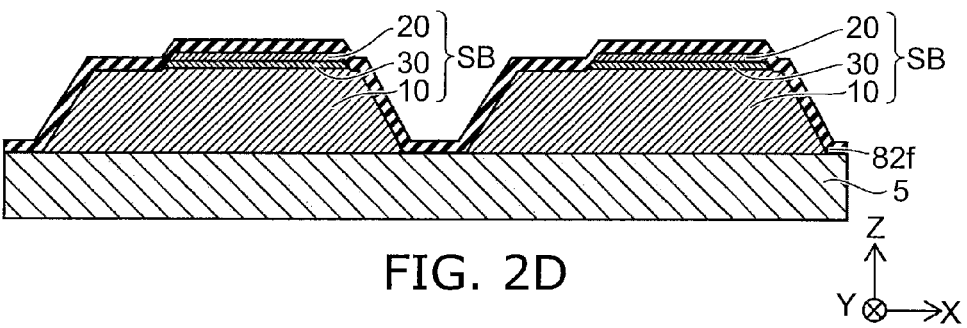

As shown in FIG. 2D, for instance, by film formation processing, a second insulating film 82f constituting a second insulating layer 82 is formed on each of the plurality of stacked bodies SB and on part of the substrate 5 exposed by the trench 90.

Figure 3A:
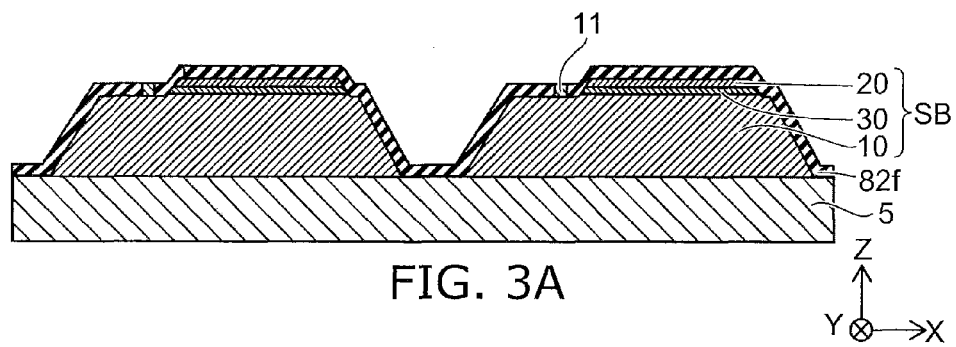

As shown in FIG. 3A, for instance, by photolithography processing, etching processing, and evaporation technique or sputtering technique, a first electrode 11 is formed on each of the plurality of stacked bodies SB.

Figure 3B:
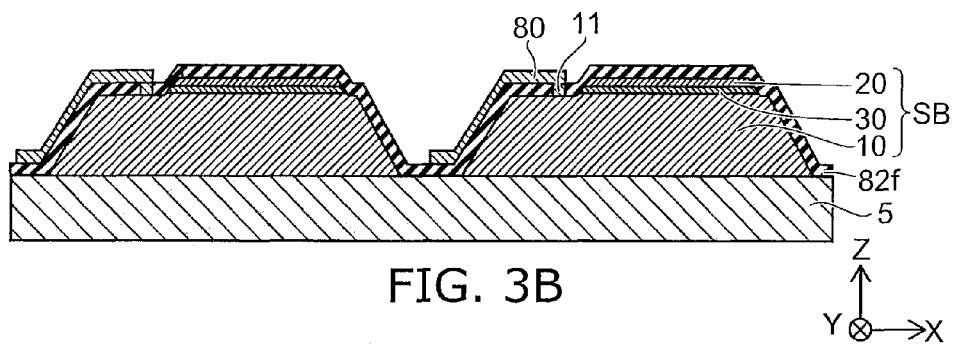

As shown in FIG. 3B, for instance, by photolithography processing, etching processing, and evaporation technique or sputtering technique, a wiring layer 80 is formed on each of the plurality of stacked bodies SB.

Figure 3C:
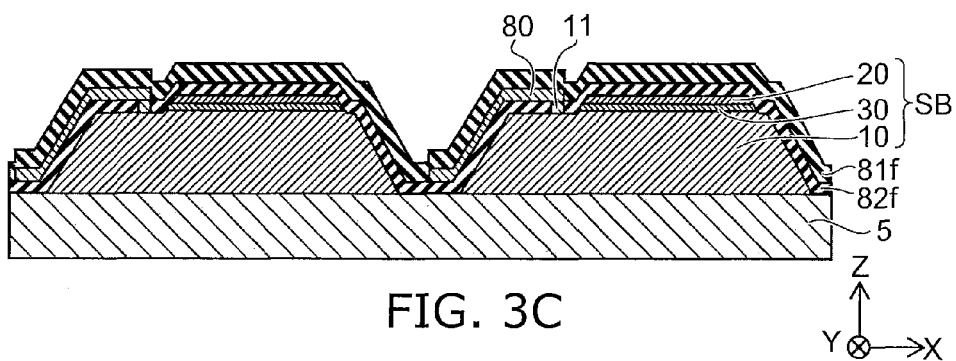

As shown in FIG. 3C, for instance, by film formation processing, a first insulating film 81f constituting a first insulating layer 81 is formed on each of the plurality of stacked bodies SB.

Figure 3D:
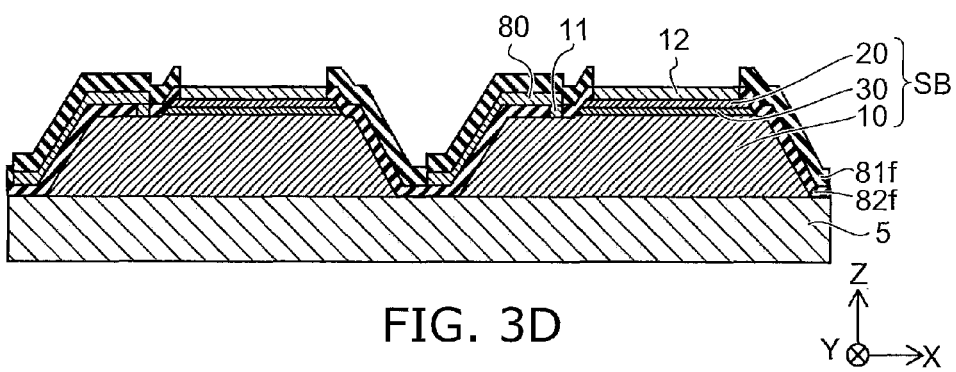

As shown in FIG. 3D, for instance, by photolithography processing, etching processing, and evaporation technique or sputtering technique, a second electrode 12 is formed on each of the plurality of stacked bodies SB.

Figure 4A:
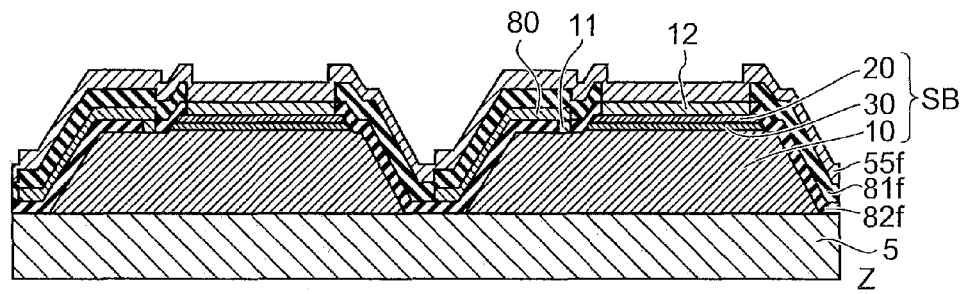

As shown in FIG. 4A, for instance, by evaporation technique or sputtering technique, a conductive film 55f constituting a second layer 55 of a metal layer 50 is formed on each of the plurality of stacked bodies SB. The conductive film 55f (second layer 55) is made of e.g. at least one of Ti, W, Pt, Au, Cu, Ni, Ag, Co, Sn, Pd, and Al. The conductive film 55f is made of an alloy including at least one of Ti, W, Pt, Au, Cu, Ni, Ag, Co, Sn, Pd, and Al. By using the above material for the conductive film 55f (second layer 55), for instance, high adhesiveness can be obtained. For instance, the conductive film 55f is made of a metal having high reflectance such as Ag.

This can facilitate reflection of light at the portion opposed to the first side surface S1 and further increase the light extraction efficiency.

Figure 4B:
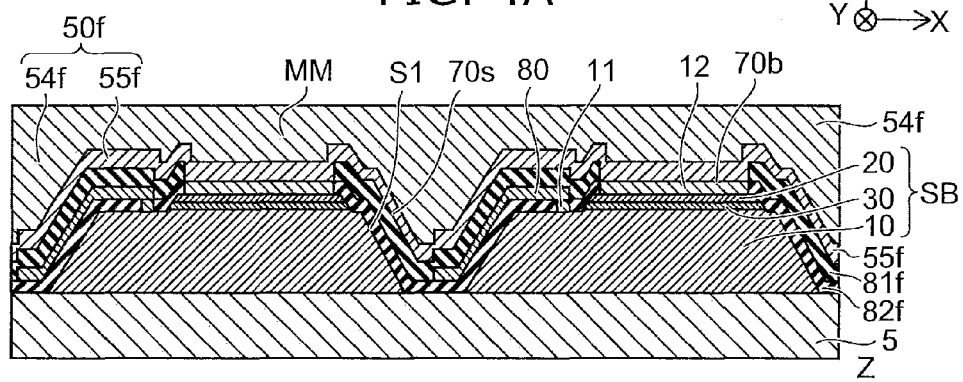

As shown in FIG. 4B, for instance, by plating processing, a conductive film 54f constituting a first layer 54 of the metal layer 50 is formed on each of the plurality of stacked bodies SB.

The conductive film 54f includes e.g. at least one of Ti, W, Pt, Au, Cu, Ni, Ag, Co, Sn, Pd, and Al. The conductive film 54f is made of e.g. an alloy including at least one of Ti, W, Pt, Au, Cu, Ni, Ag, Co, Sn, Pd, and Al. Thus, a metal material MM is deposited on the first insulating film 81f, and the trench 90 is filled with the metal material MM. Thus, a metal film 50f is formed on the first insulating film 81f. This metal film 50f includes a bottom surface portion 70b opposed to the second semiconductor layer 20 (second semiconductor film 20f), and a side surface portion 70s opposed to the first side surface S1. The side surface portion 70s surrounds the bottom surface portion 70b centered on e.g. the Z-axis direction.

Figure 4C:
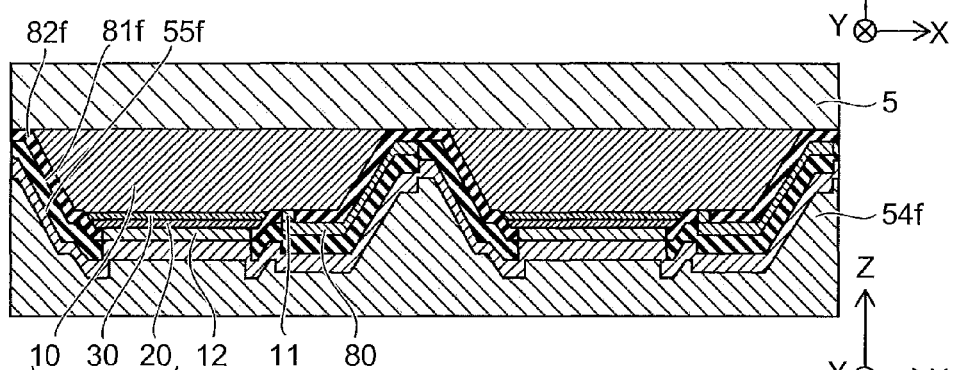
Figure 4D:
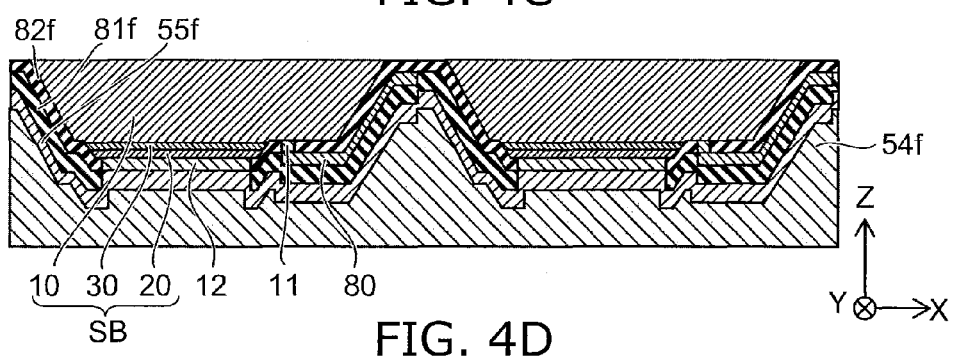

As shown in FIGS. 4C and 4D, the substrate 5 is removed. The removal of the substrate 5 can be based on e.g. at least one of grinding processing and etching processing. Thus, the stacked body SB is exposed.

Figure 5A:
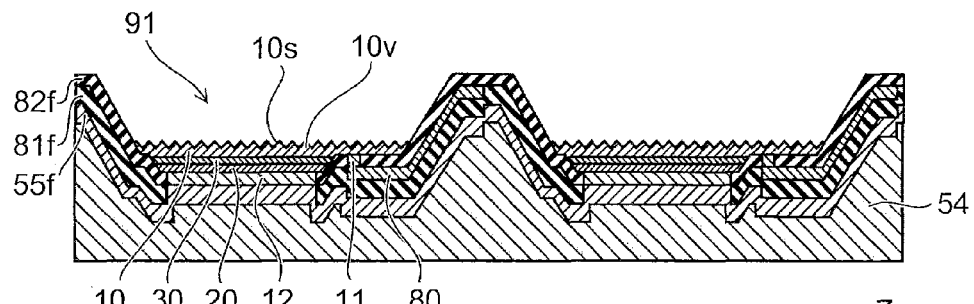

As shown in FIG. 5A, for instance, by etching processing, part of the first semiconductor layer 10 is removed. That is, the first semiconductor layer 10 is thinned. Thus, a recess 91 corresponding to the shape of the side surface portion 70s is formed. By this etching, unevenness 10v is formed on the surface 10s of the first semiconductor layer 10.

Figure 5B:
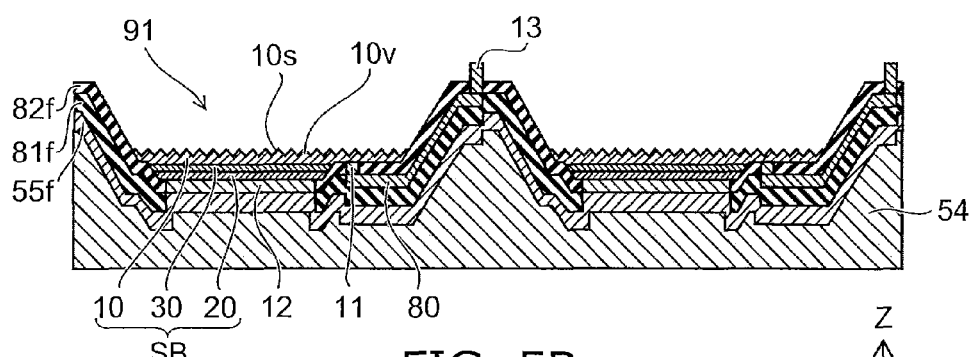

As shown in FIG. 5B, for instance, by photolithography processing, etching processing, and film formation processing, a third electrode 13 is formed on each of the plurality of stacked bodies SB. The film formation processing is based on e.g. evaporation technique or sputtering technique.

Figure 5C:
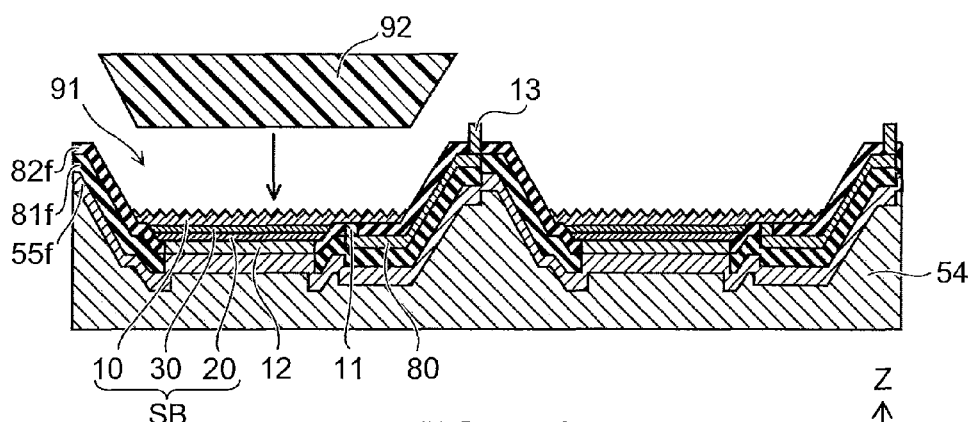

As shown in FIG. 5C, for instance, a wavelength conversion layer 40 is formed inside the recess 91. The wavelength conversion layer 40 is formed on each of the plurality of stacked bodies SB. In the formation of the wavelength conversion layer 40, for instance, a solid wavelength conversion material 92 is fitted into the recess 91.

Subsequently, the plurality of stacked bodies SB are singulated. Thus, the semiconductor light emitting device 110 according to this embodiment is completed.

In the case where silicon or the like is used for a growth substrate, the growth substrate is susceptible to thermal stress and stress due to lattice strain. Thus, during crystal growth, dislocations or cracks are likely to occur in the crystal layer. Cracks cause the decrease of manufacturing yield of the semiconductor light emitting device.

Thin-film LED is known. In this LED, for instance, after crystal growth, another support substrate (e.g., silicon support substrate) different from the crystal growth substrate is bonded to the crystal layer, and the crystal growth substrate is removed. In this thin-film LED, due to the influence of e.g. difference in linear expansion coefficient between the support substrate and the crystal layer, cracks are further induced during device fabrication. Cracks generated during device fabrication are cracks generated during the process performed after bonding the support substrate and the crystal layer (e.g., removal of the crystal growth substrate).

As a means for suppressing cracks generated during device fabrication, device separation of the crystal layer into chips is effective.

In the method for manufacturing the semiconductor light emitting device 110 according to this embodiment, device separation can be performed by forming the trench 90. Furthermore, the support substrate can be omitted, and the step of bonding to the support substrate can also be omitted.

Thus, cracks generated during device fabrication can be suppressed.

In the semiconductor light emitting device 110 according to this embodiment, the metal layer 50 is formed to a position higher than the light extraction surface of the crystal. This configuration provides high controllability of the shape (e.g., thickness) and the like of the wavelength conversion layer 40.

In the example of the method for manufacturing the semiconductor light emitting device 110 according to this embodiment, the wavelength conversion layer 40 is fabricated independently of the stacked body SB and inserted into the recess 91. For instance, a solid material such as ceramic is shaped in an appropriate shape and size to fabricate a wavelength conversion layer 40. This wavelength conversion layer 40 is put into the internal space of the recess 91. As a result of this method, the light generated inside the crystal layer efficiently passes inside the wavelength conversion layer 40. Thus, for instance, the change of chromaticity depending on the outgoing angle is suppressed. For instance, the phenomenon of the change of color depending on the viewing angle can be suppressed.

In addition, for instance, the stacked body SB can be supported by the wavelength conversion layer 40. In this case, the wavelength conversion layer 40 is thickened so as to be able to support the stacked body SB. In this configuration, the metal layer 50 can be thinned. Furthermore, in this configuration, for instance, preferably, the electrode is not formed on the light extraction surface (surface 10s).

Instead of phosphor-containing ceramic, the wavelength conversion layer 40 may be made of phosphor-containing transparent resin. In this case, electrodes and mounting wires may be provided on the light extraction surface.

In forming the wavelength conversion layer 40, a liquid wavelength conversion material may be placed inside the recess 91 and solidified.

As described above, in the semiconductor light emitting device 110 according to this embodiment, the heat dissipation of the wavelength conversion layer 40 can be improved while improving the heat dissipation of the crystal layer. Furthermore, the uniformity of color can also be improved.

Furthermore, this embodiment can also suppress generation of cracks during manufacturing. Furthermore, this embodiment can also suppress manufacturing cost. For instance, in the method of bonding the crystal layer and the silicon support substrate using AuSn solder, use of gold results in relatively high manufacturing cost. In contrast, this embodiment can adopt the method of forming the metal layer 50 by plating technique and the like. Thus, this embodiment can suppress cost relative to e.g. the method of using AuSn solder. Furthermore, in the method of bonding the crystal layer and the silicon support substrate, voids (gaps) are likely to occur between the crystal layer and the silicon support substrate. The void decreases e.g. mechanical strength, and decreases the reliability of the semiconductor light emitting device. In contrast, in the semiconductor light emitting device 110 according to this embodiment, the metal layer 50 can be formed by plating technique and the like. Thus, the occurrence of voids is suppressed, and the reliability can be further improved.

In this example, the metal layer 50 includes the first layer 54 and the second layer 55. The thickness of the first layer 54 is e.g. 10 μm or more and 1000 μm or less. Forming the first layer 54 by e.g. evaporation technique or sputtering technique takes time. In contrast, forming the first layer 54 by plating technique can make the manufacturing time shorter than the case of using e.g. evaporation technique or sputtering technique. Forming the second layer 55 by e.g. evaporation technique or sputtering technique can further enhance adhesiveness e.g. between the metal layer 50 and the second electrode 12.

In the above example of the manufacturing method, a trench 90 for exposing part of the substrate 5 is formed, and a stacked body SB is formed by the formation of the trench 90. In this embodiment, the trench 90 does not need to reach the substrate 5. The depth of the trench 90 is comparable to or longer than the thickness t1 of the stacked body SB of the semiconductor light emitting device 110 to be manufactured.

In the case where the trench 90 does not reach the substrate 5, for instance, in the step of thinning the first semiconductor layer 10 shown in FIG. 5A, the first semiconductor film 10f is divided to form a plurality of stacked bodies SB from the stacked film SF.

FIGS. 6A to 6D, 7A to 7D, 8A to 8D, and 9A to 9C are schematic sectional views showing an alternative method for manufacturing a semiconductor light emitting device according to the first embodiment.

Figure 6A:
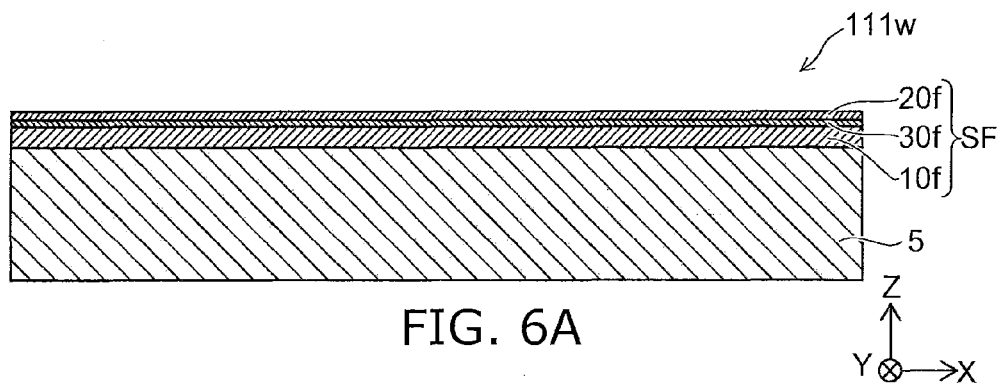
FIGS. 6A to 6D, 7A to 7D, 8A to 8D, and 9A to 9C are schematic sectional views showing an alternative method for manufacturing a semiconductor light emitting device according to the first embodiment.

As shown in FIG. 6A, a workpiece 111w is prepared.

Figure 6B:
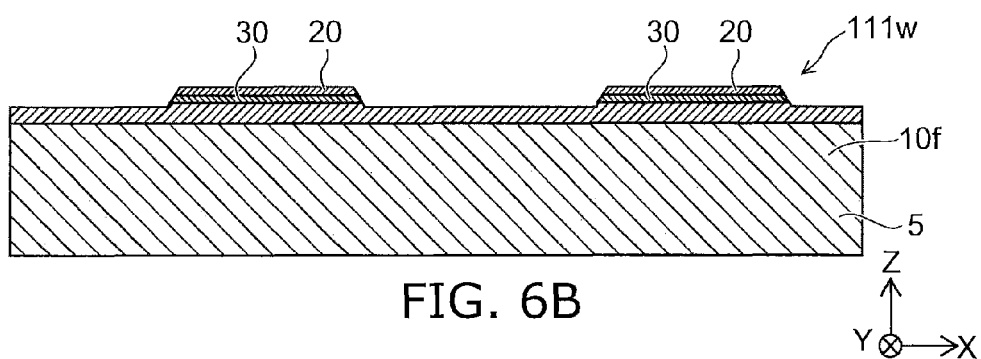

As shown in FIG. 6B, for instance, by photolithography processing and etching processing, part of the first semiconductor film 10f, part of the second semiconductor film 20f, and part of the light emitting film 30f are removed. Thus, part of the first semiconductor film 10f is exposed. Furthermore, a second semiconductor layer 20 is formed from the second semiconductor film 20f, and a light emitting layer 30 is formed from the light emitting film 30f.

Figure 6C:
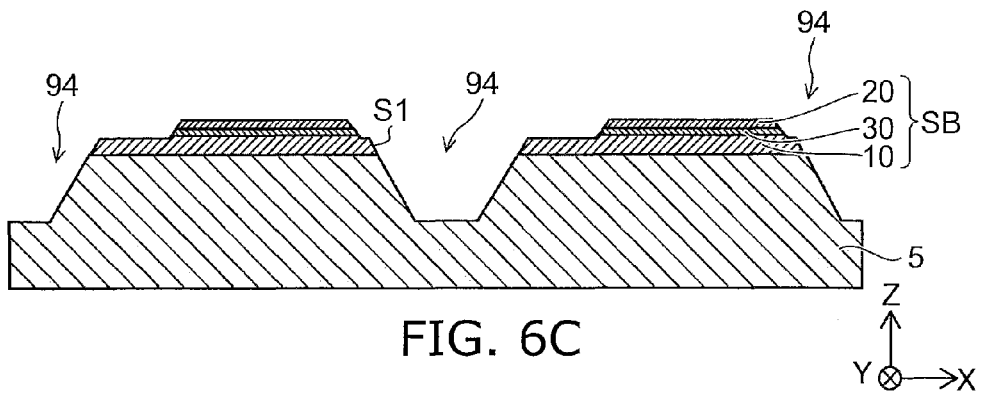

As shown in FIG. 6C, for instance, by photolithography processing and etching processing, part of the first semiconductor film 10f and part of the substrate 5 are removed to form a plurality of trenches 94. Thus, a first semiconductor layer 10 is formed from the first semiconductor film 10f, and a plurality of stacked bodies SB are formed from the stacked film SF. The trench 94 exposes a first side surface S1 of the first semiconductor layer 10.

Figure 6D:
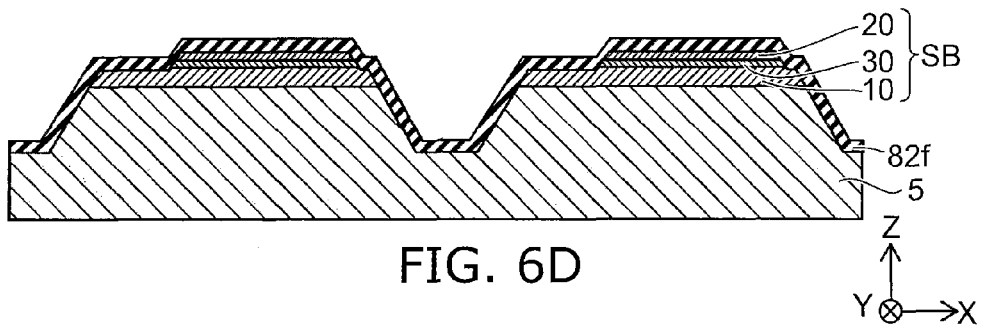

As shown in FIG. 6D, for instance, by film formation processing, a second insulating film 82f is formed on each of the plurality of stacked bodies SB and on part of the substrate 5 exposed by the trench 94.

Figure 7A:
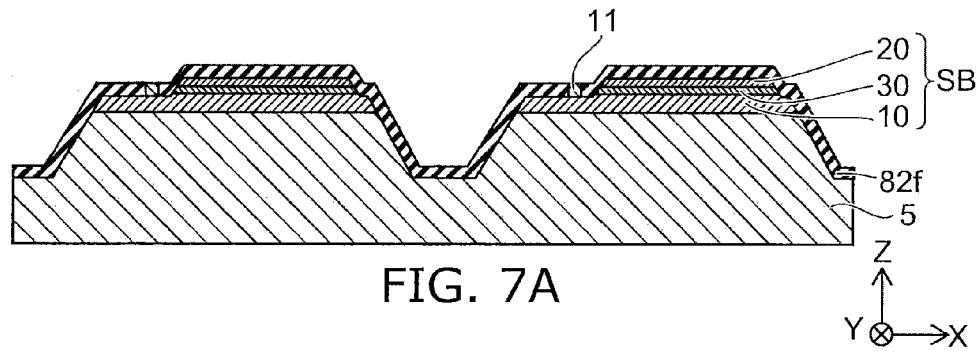

As shown in FIG. 7A, for instance, by photolithography processing, etching processing, and evaporation technique or sputtering technique, a first electrode 11 is formed on each of the plurality of stacked bodies SB.

Figure 7B:
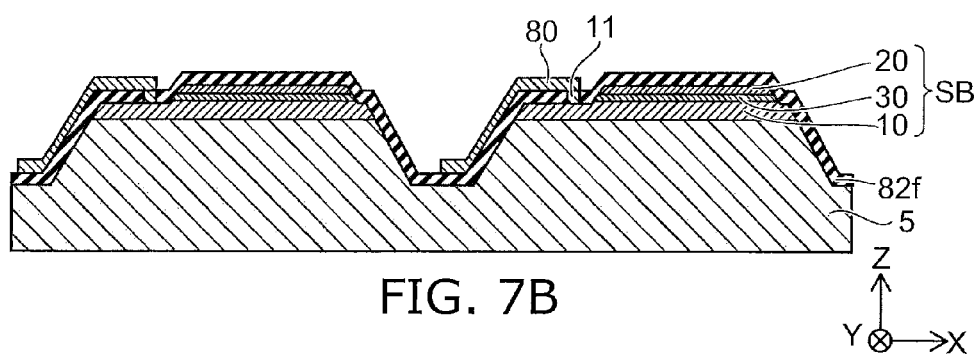

As shown in FIG. 7B, for instance, by photolithography processing, etching processing, and evaporation technique or sputtering technique, a wiring layer 80 is formed on each of the plurality of stacked bodies SB.

Figure 7C:
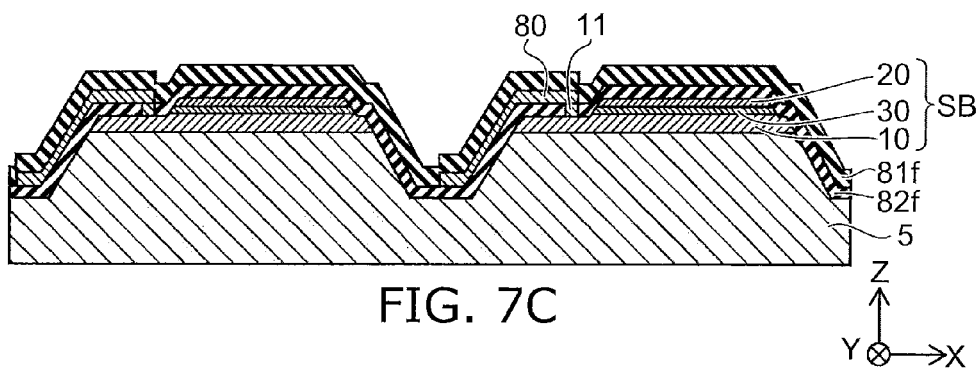

As shown in FIG. 7C, for instance, by film formation processing, a first insulating film 81f is formed on each of the plurality of stacked bodies SB.

Figure 7D:
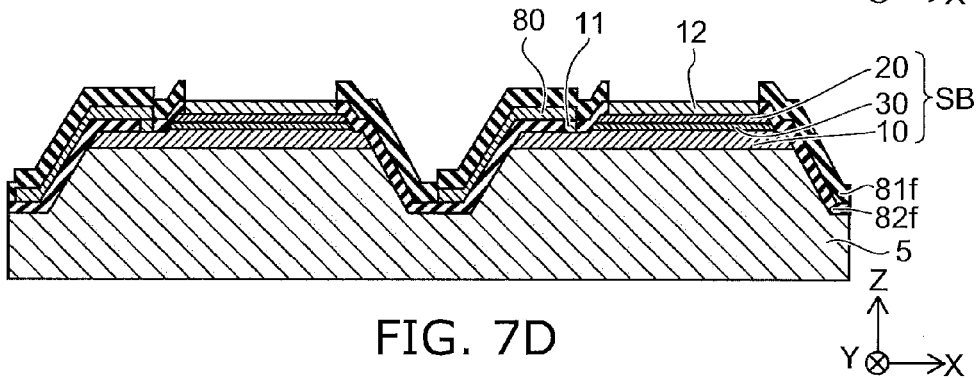

As shown in FIG. 7D, for instance, by photolithography processing, etching processing, and film formation processing (such as evaporation technique and sputtering technique), a second electrode 12 is formed on each of the plurality of stacked bodies SB.

Figure 8A:
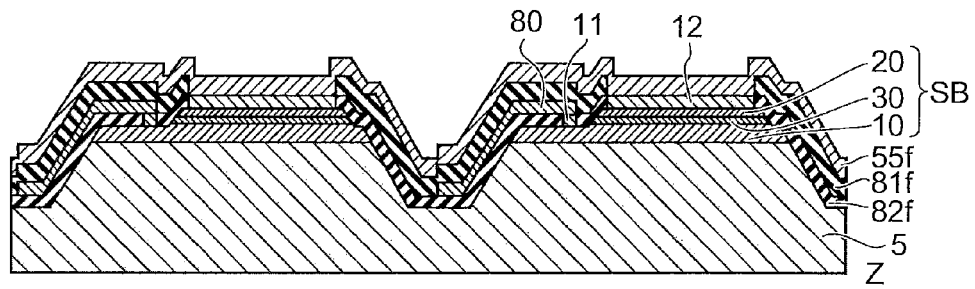

As shown in FIG. 8A, for instance, by evaporation technique or sputtering technique, a conductive film 55f constituting a second layer 55 of a metal layer 50 is formed on each of the plurality of stacked bodies SB.

Figure 8B:
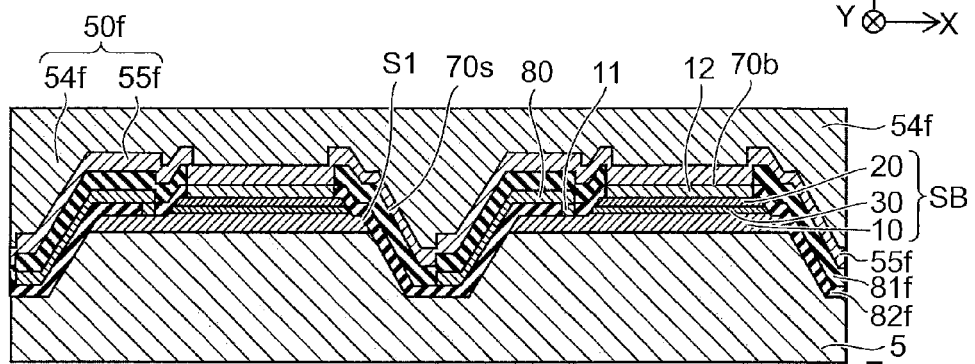

As shown in FIG. 8B, for instance, by plating processing, a conductive film 54f constituting a first layer 54 of the metal layer 50 is formed on each of the plurality of stacked bodies SB. Thus, a metal film 50f is formed on the first insulating film 81f. The metal film 50f includes a bottom surface portion 70b opposed to the second semiconductor layer 20, and a side surface portion 70s opposed to the first side surface S1.

Figure 8C:
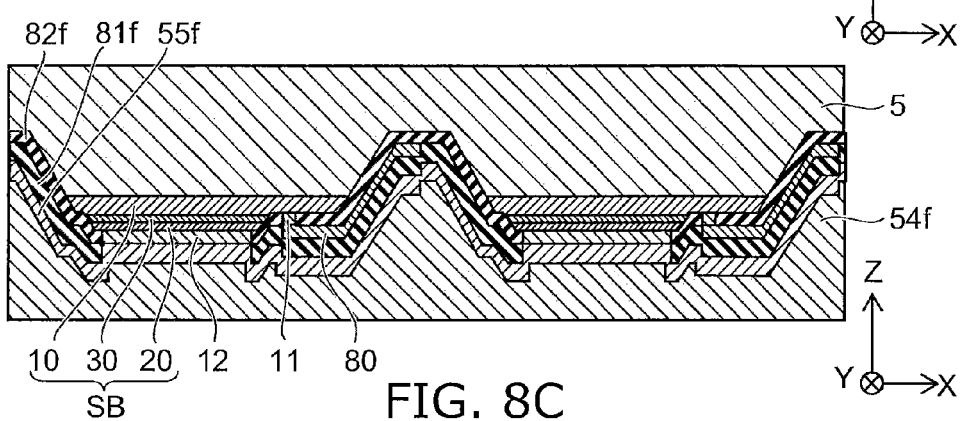
Figure 8D:
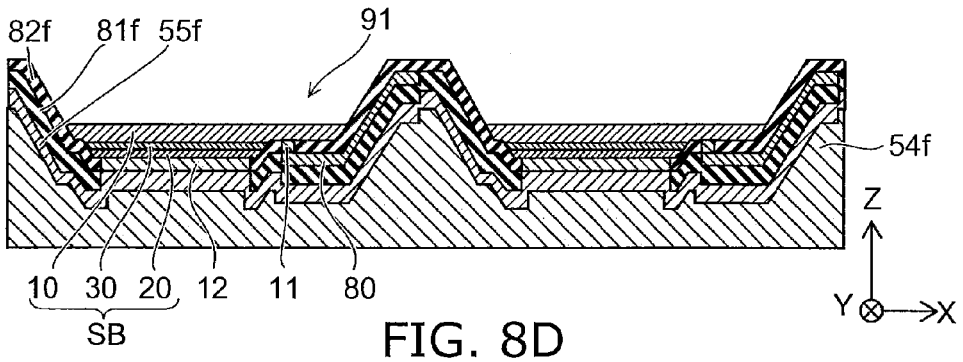

As shown in FIGS. 8C and 8D, for instance, by at least one of grinding processing and etching processing, the substrate 5 is removed. Thus, a recess 91 corresponding to the shape of the side surface portion 70s is formed.

Figure 9A:
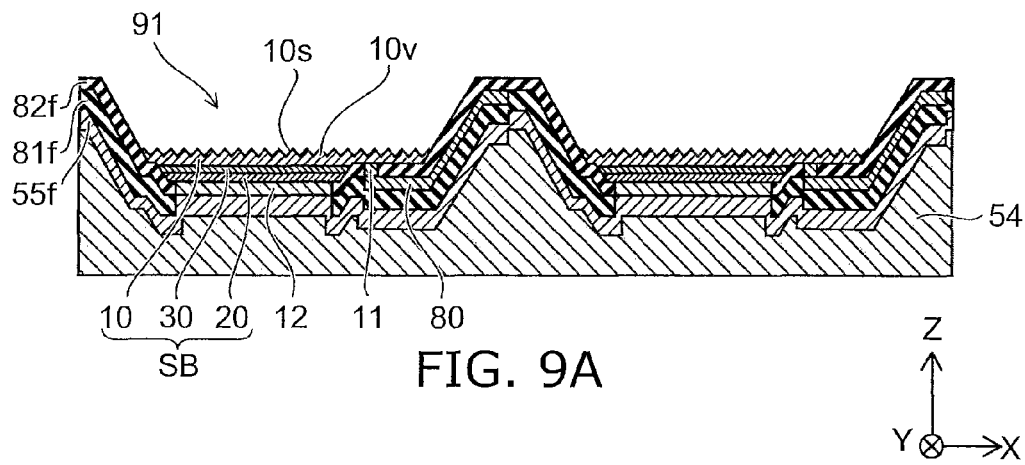

As shown in FIG. 9A, for instance, by etching processing, part of the first semiconductor layer 10 is removed. Thus, unevenness 10v is formed on the surface 10s of the first semiconductor layer 10.

Figure 9B:
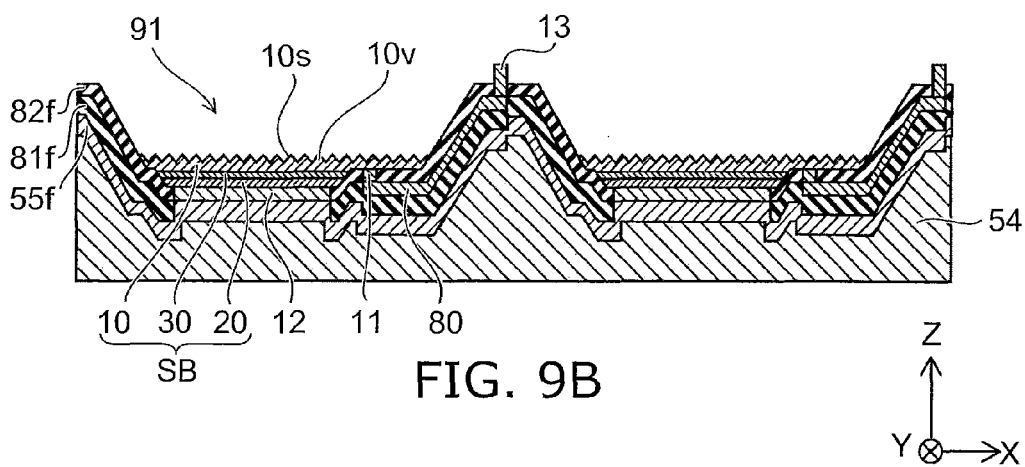

As shown in FIG. 9B, for instance, by photolithography processing, etching processing, and evaporation technique or sputtering technique, a third electrode 13 is formed on each of the plurality of stacked bodies SB.

Figure 9C:
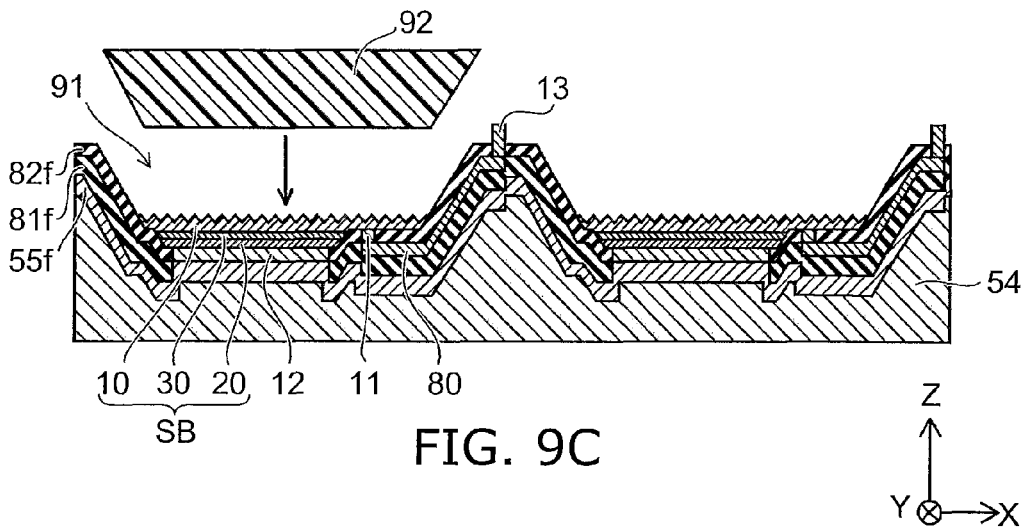

As shown in FIG. 9C, for instance, by fitting a wavelength conversion material 92 into the recess 91, a wavelength conversion layer 40 is formed on each of the plurality of stacked bodies SB.

Subsequently, the plurality of stacked bodies SB are singulated. Thus, the semiconductor light emitting device 110 according to this embodiment is completed.

As described above, in the method for manufacturing the semiconductor light emitting device 110, a trench 94 removing part of the first semiconductor film 10f and part of the substrate 5 may be formed. In this manufacturing method, for instance, unevenness is likely to be formed on the surface of the trench 94 by etching. As a result, unevenness is formed also on the surface of the second insulating film 82f in contact with the trench 94. This enhances adhesiveness e.g. at the contact portion between the second insulating film 82f and the wavelength conversion layer 40. This is effective also in enhancing the fixing strength of the wavelength conversion layer 40.

Figure 10A:
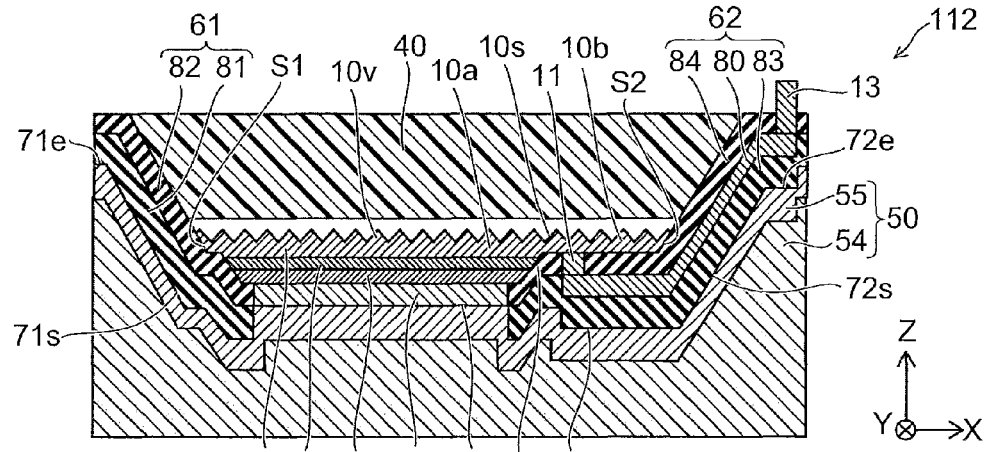
FIGS. 10A to 10C are schematic sectional views showing alternative semiconductor light emitting devices according to the first embodiment.
Figure 10B:
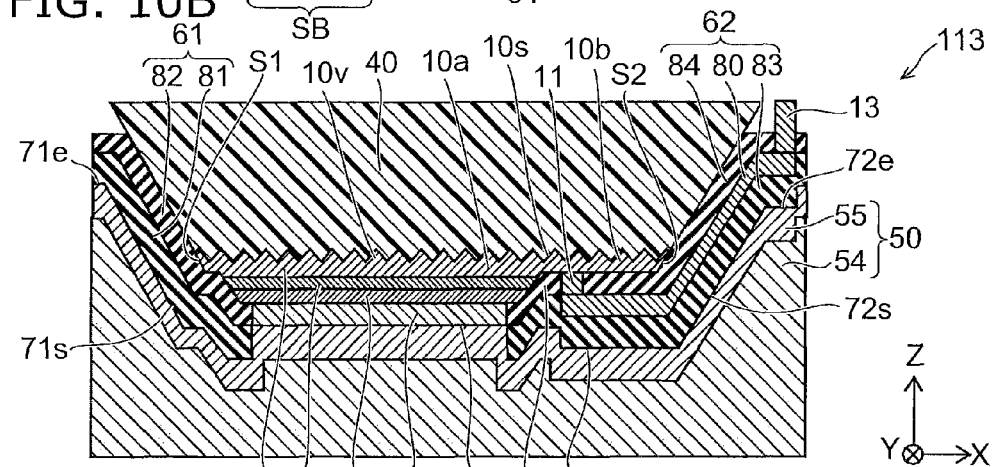
Figure 10C:
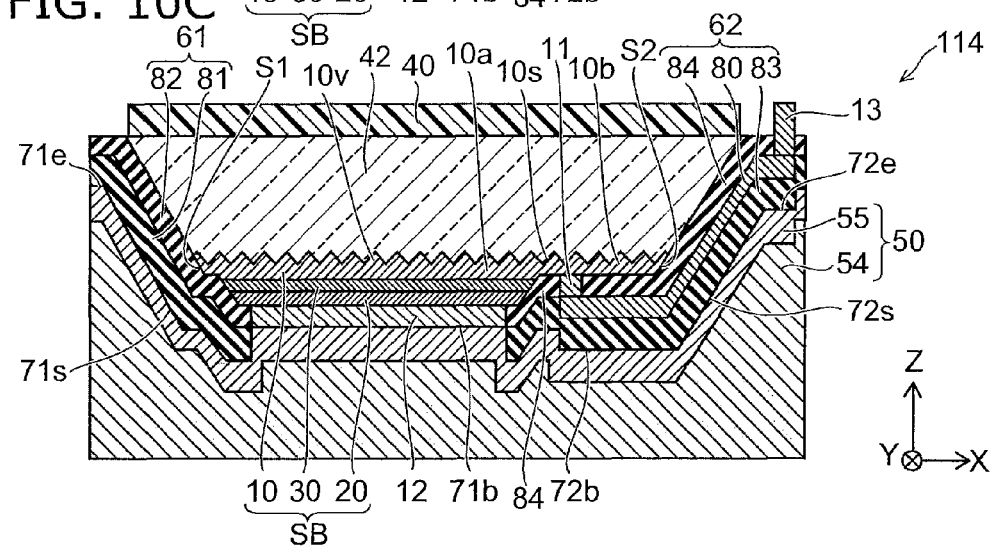

FIGS. 10A to 10C are schematic sectional views showing alternative semiconductor light emitting devices according to the first embodiment.

As shown in FIG. 10A, in the semiconductor light emitting device 112, the wavelength conversion layer 40 is spaced from the first semiconductor layer 10. Thus, the wavelength conversion layer 40 does not necessarily need to be in contact with the first semiconductor layer 10. In the case where the wavelength conversion layer 40 is spaced from the first semiconductor layer 10, for instance, formation of the wavelength conversion layer 40 is easier than in the case where the wavelength conversion layer 40 is in contact with the first semiconductor layer 10. In the semiconductor light emitting device 112, transparent resin and the like may be embedded in the space between the first semiconductor layer 10 and the wavelength conversion layer 40. Part of the transparent resin may extend out to e.g. the outside of the recess 91. The transparent resin is preferably embedded so as not to form a gap between the transparent resin and the wavelength conversion layer 40. This can enhance adhesiveness between the wavelength conversion layer 40 and the crystal layer. In this case, the transparent resin serves as an adhesive layer between the wavelength conversion layer 40 and the first semiconductor layer 10, between the wavelength conversion layer 40 and the first insulating section 61, and between the wavelength conversion layer 40 and the second insulating section 62. This transparent resin is thinned by being sandwiched therebetween, and can be regarded substantially as a wavelength conversion layer 40. A gap may occur between the transparent resin and the wavelength conversion layer 40 or between the transparent resin and the unevenness 10v.

As shown in FIG. 10B, in the semiconductor light emitting device 113, the height (position in the Z-axis direction) of the wavelength conversion layer 40 is higher than the height of the second insulating layer 82. In other words, the thickness of the wavelength conversion layer 40 is thicker than the depth (length along the Z-axis direction) of the recess 91. In the semiconductor light emitting device 110, the height of the wavelength conversion layer 40 is substantially equal to the height of the second insulating layer 82. However, as shown in the semiconductor light emitting device 113, the height of the wavelength conversion layer 40 may be higher than that of the second insulating layer 82. Thus, for instance, formation of the wavelength conversion layer 40 can be made easier than in the configuration of the semiconductor light emitting device 110. Alternatively, the height of the wavelength conversion layer 40 may be lower than that of the second insulating layer 82.

As shown in FIG. 10C, in the semiconductor light emitting device 114, the wavelength conversion layer 40 is shaped like a plate. Furthermore, in the semiconductor light emitting device 114, a transparent resin layer 42 is provided between the wavelength conversion layer 40 and the first semiconductor layer 10. The transparent resin layer 42 has light transmissivity to the emission light of the light emitting layer 30. For instance, the recess 91 is filled with the transparent resin layer 42, and a plate-like wavelength conversion layer 40 is provided on the transparent resin layer 42. Thus, the semiconductor light emitting device 114 is formed. In this configuration, for instance, formation of the wavelength conversion layer 40 is easier. The width (length along the X-axis direction) of the plate-like wavelength conversion layer 40 may be longer or shorter than the width of the recess 91. In the case where the width of the wavelength conversion layer 40 is longer than the width of the recess 91, for instance, alignment between the wavelength conversion layer 40 and the recess 91 is easier. On the other hand, in the case where the width of the wavelength conversion layer 40 is shorter than the width of the recess 91, for instance, the wavelength conversion layer 40 can be fitted into the recess 91.

Thus, the wavelength conversion layer 40 can be based on the configuration of being fitted into the recess 91. The wavelength conversion layer 40 can be based on an arbitrary configuration in which the first semiconductor layer 10 can be placed between the light emitting layer 30 and the wavelength conversion layer 40. A solid wavelength conversion layer 40 may be placed inside the recess 91. Alternatively, a liquid material may be placed in the recess 91 and solidified to form a wavelength conversion layer 40.

Figure 11A:
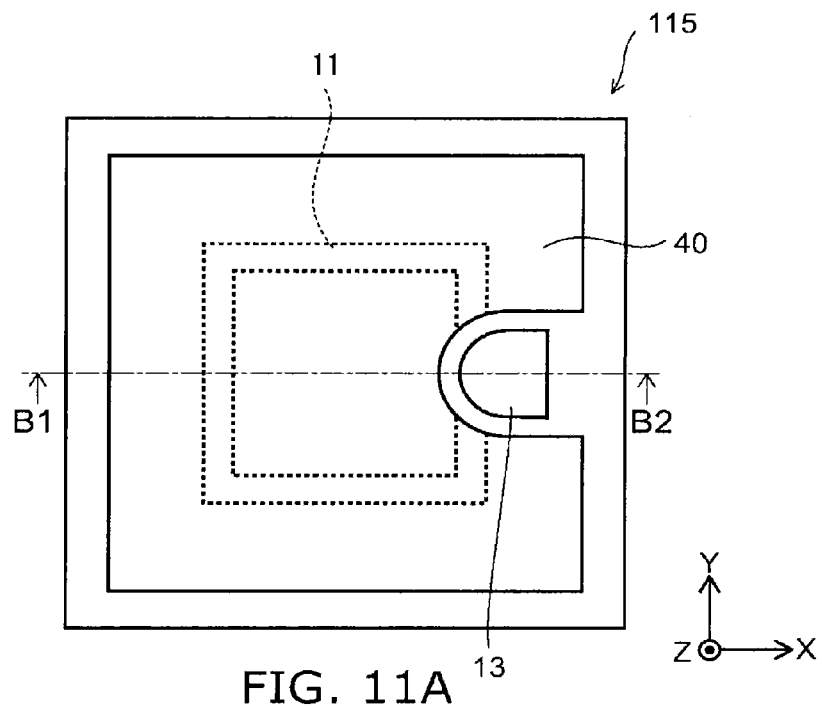
FIGS. 11A and 11B are schematic views showing an alternative semiconductor light emitting device according to the first embodiment.
Figure 11B:
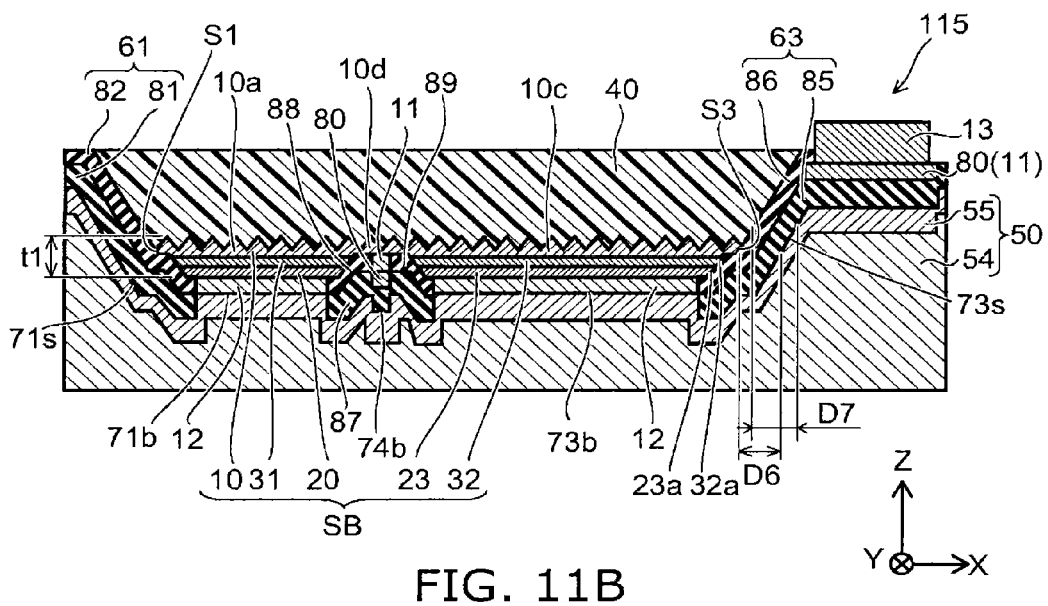

FIGS. 11A and 11B are schematic views showing an alternative semiconductor light emitting device according to the first embodiment.

FIG. 11A is a schematic plan view. FIG. 11B is a schematic sectional view showing a cross section taken along line B1-B2 of FIG. 11A.

As shown in FIGS. 11A and 11B, in the semiconductor light emitting device 115, the first electrode 11 is shaped like a frame. For instance, in this example, the first electrode 11 is shaped like a rectangle including a portion extending in the X-axis direction and a portion extending in the Y-axis direction.

FIG. 11B shows a cross section of the portion of the first electrode 11 extending in the Y-axis direction. Furthermore, in the semiconductor light emitting device 115, the third electrode 13 is placed around the center in the Y-axis direction.

In the semiconductor light emitting device 115, the stacked body SB includes a first semiconductor layer 10, a second semiconductor layer 20, a third semiconductor layer 23, a first light emitting layer 31, and a second light emitting layer 32.

The third semiconductor layer 23 is spaced from the first semiconductor layer 10 in the Z-axis direction, and spaced from the second semiconductor layer 20 in a third direction non-parallel to the Z-axis direction. The third semiconductor layer 23 is of the second conductivity type. The third direction may be an arbitrary direction non-parallel to the Z-axis direction.

The first light emitting layer 31 is provided between the first semiconductor layer 10 and the second semiconductor layer 20. The second light emitting layer 32 is provided between the first semiconductor layer 10 and the third semiconductor layer 23.

The first semiconductor layer 10 has a first portion 10a opposed to the first light emitting layer 31, a third portion 10c juxtaposed with the first portion 10a in the third direction and opposed to the second light emitting layer 32, and a fourth portion 10d provided between the first portion 10a and the third portion 10c in the third direction and not opposed to the first light emitting layer 31 and the second light emitting layer 32. The third portion 10c has a third side surface S3 nonparallel to the X-Y plane.

The metal layer 50 (first metal layer) further includes a third side surface portion 73s, a third bottom surface portion 73b, and a fourth bottom surface portion 74b. The third side surface portion 73s is opposed to at least part of the wavelength conversion layer 40, and the third side surface S3. The third bottom surface portion 73b is opposed to the third portion 10c. The fourth bottom surface portion 74b is opposed to the fourth portion 10d. The fourth bottom surface portion 74b is continuous with the first bottom surface portion 71b and the third bottom surface portion 73b. The first bottom surface portion 71b is opposed to the first portion 10a.

The distance D6 between the third side surface S3 and the third side surface portion 73s and the distance D7 between the wavelength conversion layer 40 and the third side surface portion 73s are preferably less than or equal to e.g. the thickness t1 in the Z-axis direction of the stacked body SB. This provides e.g. good heat dissipation. The distance D6 and the distance D7 are e.g. 10 μm or less. More preferably, the distance D6 and the distance D7 are e.g. 1 μm or less. This can provide e.g. good heat dissipation. Furthermore, the distance D6 and the distance D7 are e.g. 0.1 μm or more. This provides good insulation.

The semiconductor light emitting device 115 further includes a third insulating section 63. The third insulating section 63 is provided between the third side surface S3 and the third side surface portion 73s and between the wavelength conversion layer 40 and the third side surface portion 73s, and electrically insulates between the first semiconductor layer 10 and the metal layer 50. The third insulating section 63 covers e.g. the third side surface S3. The third insulating section 63 covers e.g. the side surface of the wavelength conversion layer 40. The third insulating section 63 includes e.g. a fifth insulating layer 85 provided between the metal layer 50 and the third side surface S3, and a sixth insulating layer 86 provided between the fifth insulating layer 85 and the third side surface S3. The first insulating layer 81 and the fifth insulating layer 85 may constitute one continuous layer. The second insulating layer 82 and the sixth insulating layer 86 may constitute one continuous layer. The third insulating section 63 is in contact with e.g. the metal layer 50, the third side surface S3, and the wavelength conversion layer 40. In this example, the third insulating section 63 extends also between the side surface 23a of the third semiconductor layer 23 and the metal layer 50 and between the side surface 32a of the second light emitting layer 32 and the metal layer 50.

The first electrode 11 extends between the fourth portion 10d and the fourth bottom surface portion 74b. As described in the above embodiment, the first electrode 11 is electrically connected to the wiring layer 80, and electrically connected to the third electrode 13 through the wiring layer 80.

A seventh insulating layer 87 is provided between the fourth bottom surface portion 74b and the wiring layer 80. The seventh insulating layer 87 electrically insulates between the metal layer 50 and the wiring layer 80. An eighth insulating layer 88 is provided between the first electrode 11 and the second semiconductor layer 20, between the first electrode 11 and the first light emitting layer 31, and between the first electrode 11 and the second electrode 12. The eighth insulating layer 88 electrically insulates between the first electrode 11 and the second semiconductor layer 20, electrically insulates between the first electrode 11 and the first light emitting layer 31, and electrically insulates between the first electrode 11 and the second electrode 12. A ninth insulating layer 89 is provided between the first electrode 11 and the third semiconductor layer 23, between the first electrode 11 and the second light emitting layer 32, and between the first electrode 11 and the second electrode 12. The ninth insulating layer 89 electrically insulates between the first electrode 11 and the third semiconductor layer 23, electrically insulates between the first electrode 11 and the second light emitting layer 32, and electrically insulates between the first electrode 11 and the second electrode 12. The seventh insulating layer 87 may constitute one layer continuous with the first insulating layer 81 and the fifth insulating layer 85. The eighth insulating layer 88 and the ninth insulating layer 89 may constitute one layer continuous with the second insulating layer 82 and the sixth insulating layer 86.

Also in the semiconductor light emitting device 115, as in the semiconductor light emitting device 110, good heat dissipation can be obtained.

(Second Embodiment)

Figure 12:
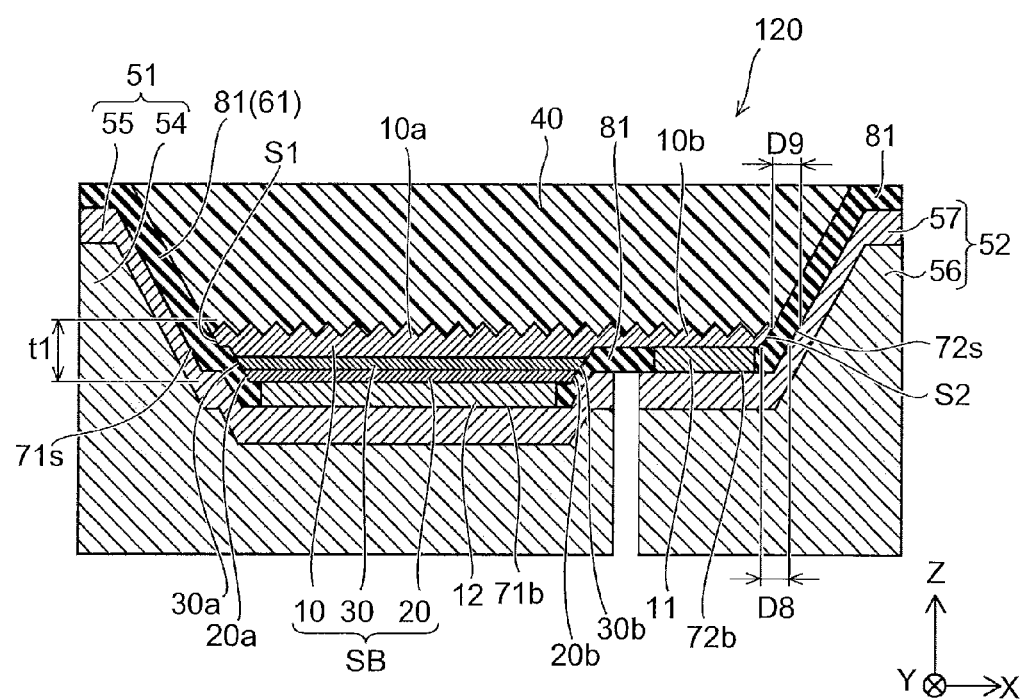
FIG. 12 is a schematic sectional view showing a semiconductor light emitting device according to a second embodiment.

FIG. 12 is a schematic sectional view showing a semiconductor light emitting device according to a second embodiment.

As shown in FIG. 12, the semiconductor light emitting device 120 of this example includes a first metal layer 51 and a second metal layer 52. The first metal layer 51 and the second metal layer 52 enable energization from the rear surface side (opposite side from the light extraction surface).

The first semiconductor layer 10 has a first portion 10a opposed to the light emitting layer 30, and a second portion 10b juxtaposed with the first portion 10a in a direction nonparallel to the Z-axis direction and not opposed to the light emitting layer 30. The second portion 10b has a second side surface S2.

Like the metal layer 50 of the above first embodiment, the first metal layer 51 includes a first side surface portion 71s and a first bottom surface portion 71b. The first side surface portion 71s is opposed to at least part of the wavelength conversion layer 40, and the first side surface S1. Furthermore, like the metal layer 50 of the above first embodiment, the first metal layer 51 includes a first layer 54 and a second layer 55.

In this example, the first insulating section 61 is formed from the first insulating layer 81. The first insulating layer 81 is provided between the first side surface S1 and the first side surface portion 71s and between the wavelength conversion layer 40 and the first side surface portion 71s. The first insulating layer 81 extends also between the side surface 30a and the first metal layer 51, between the side surface 20a and the first metal layer 51, between the side surface 20b and the first metal layer 51, and between the side surface 30b and the first metal layer 51. The first insulating layer 81 extends also between the second side surface S2 and the second side surface portion 72s and between the wavelength conversion layer 40 and the second side surface portion 72s.

The second metal layer 52 includes a second side surface portion 72s and a second bottom surface portion 72b. The second side surface portion 72s is opposed to at least part of the wavelength conversion layer 40, and the second side surface S2. The second bottom surface portion 72b is opposed to the second portion 10b. The second metal layer 52 is electrically insulated from the first metal layer 51. In this example, the second metal layer 52 is electrically insulated from the first metal layer 51 by separation between the first metal layer 51 and the second metal layer 52. A dielectric, resin and the like having insulating property may be provided between the first metal layer 51 and the second metal layer 52. The position of separation between the first metal layer 51 and the second metal layer 52 may be a position near the first electrode 11 as shown in FIG. 12, or may be a position near the second electrode 12. Also in this example, the distance D8 between the second side surface S2 and the second side surface portion 72s and the distance D9 between the wavelength conversion layer 40 and the second side surface portion 72s are preferably less than or equal to e.g. the thickness t1 in the Z-axis direction of the stacked body SB. This provides e.g. good heat dissipation. The distance D8 and the distance D9 are e.g. 10 μm or less. More preferably, the distance D8 and the distance D9 are e.g. 1 μm or less. This can provide e.g. good heat dissipation. Furthermore, the distance D8 and the distance D9 are e.g. 0.1 μm or more. This provides good insulation.

In this example, the second metal layer 52 includes a third layer 56 and a fourth layer 57. The third layer 56 is made of e.g. substantially the same material as the first layer 54. The fourth layer 57 is made of e.g. substantially the same material as the second layer 55.

The first electrode 11 is provided between the second portion 10b and the second bottom surface portion 72b, and electrically connected to the first semiconductor layer 10 and the second metal layer 52. The second electrode 12 is provided between the second semiconductor layer 20 and the first bottom surface portion 71b, and electrically connected to the second semiconductor layer 20 and the first metal layer 51. Thus, in the semiconductor light emitting device 120, the light emitting layer 30 can be energized from the rear surface side by the first metal layer 51 and the second metal layer 52.

Also in the semiconductor light emitting device 120, as in the semiconductor light emitting device 110, good heat dissipation can be obtained.

Next, a method for manufacturing the semiconductor light emitting device 120 is described.

FIGS. 13A to 13D, 14A to 14E, and 15A to 15D are schematic sectional views showing the method for manufacturing a semiconductor light emitting device according to the second embodiment.

Figure 13A:
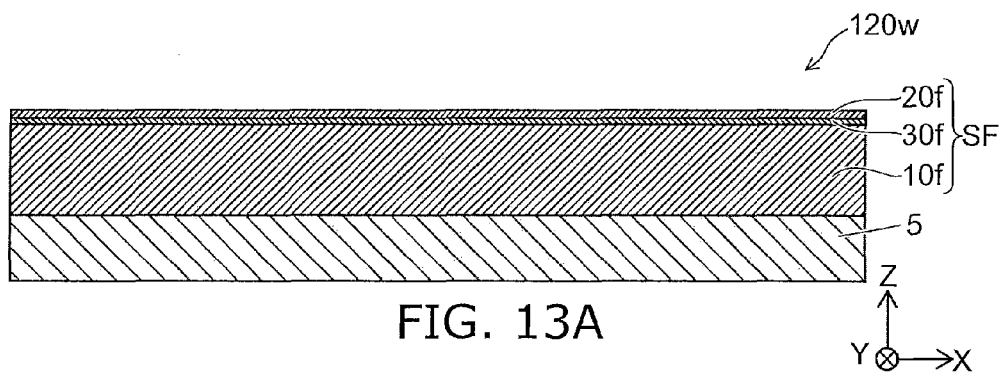

As shown in FIG. 13A, a workpiece 120w is prepared. The workpiece 120w is substantially identical to the workpiece 110w.

Figure 13B:
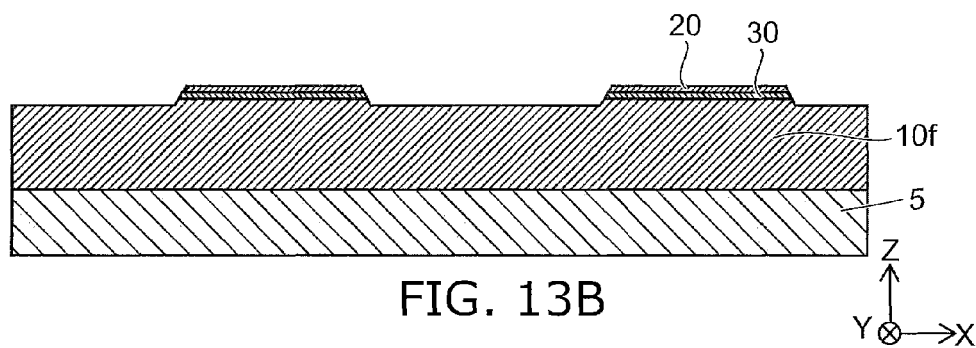

As shown in FIG. 13B, for instance, by photolithography processing and etching processing, part of the second semiconductor film 20f and part of the light emitting film 30f are removed.

Figure 13C:
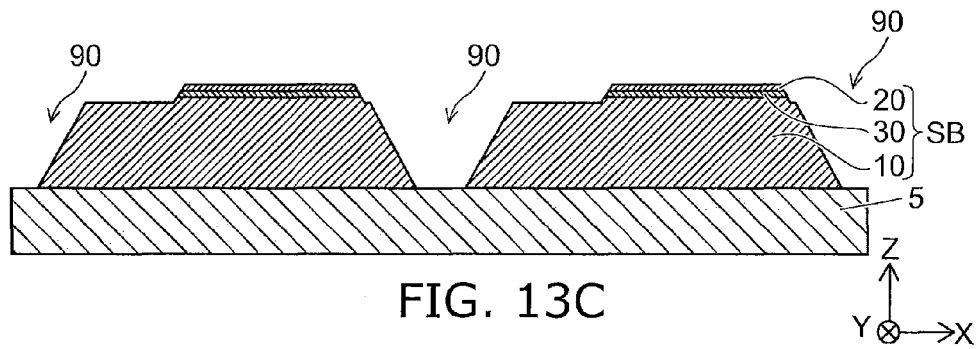

As shown in FIG. 13C, for instance, by photolithography processing and etching processing, part of the first semiconductor film 10f is removed to form a plurality of trenches 90.

Figure 13D:
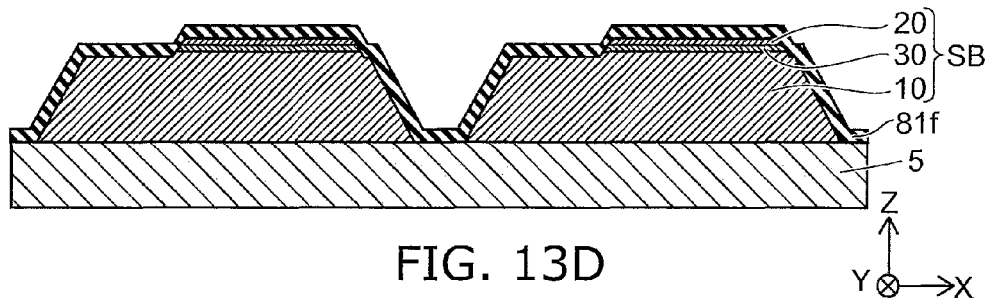

As shown in FIG. 13D, for instance, by film formation processing, a first insulating film 81f is formed on each of the plurality of stacked bodies SB and on part of the substrate 5 exposed by the trench 90.

Figure 14A:
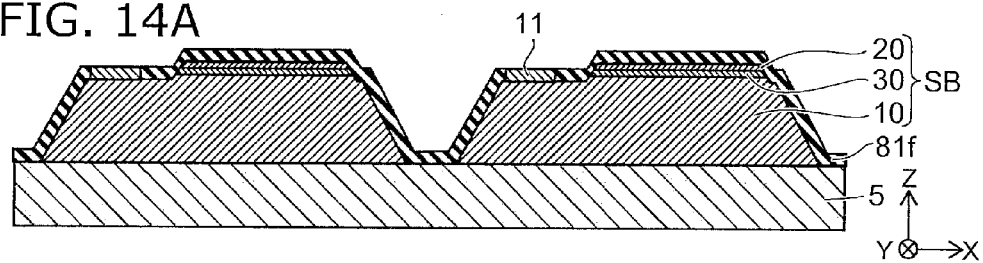

As shown in FIG. 14A, for instance, by photolithography processing, etching processing, and evaporation technique or sputtering technique, a first electrode 11 is formed on each of the plurality of stacked bodies SB.

Figure 14B:
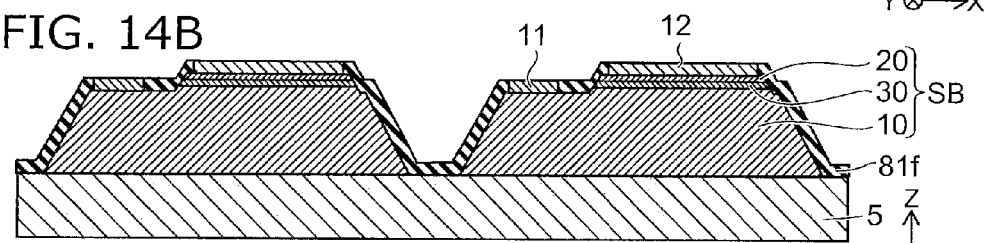

As shown in FIG. 14B, for instance, by photolithography processing, etching processing, and evaporation technique or sputtering technique, a second electrode 12 is formed on each of the plurality of stacked bodies SB.

Figure 14C:
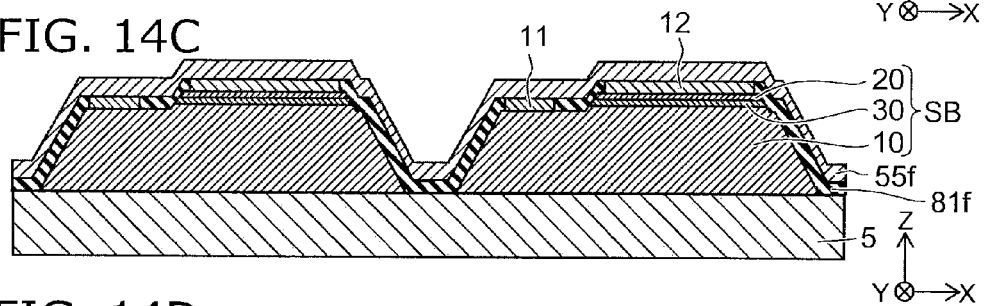

As shown in FIG. 14C, for instance, by evaporation technique or sputtering technique, a conductive film 55f constituting a second layer 55 of a first metal layer 51 and a fourth layer 57 of a second metal layer 52 is formed on each of the plurality of stacked bodies SB. Here, a metal film (what is called the pad metal) for enhancing adhesiveness between the first electrode 11 and the conductive film 55f may be further provided between the first electrode 11 and the conductive film 55f. Similarly, a metal film for enhancing adhesiveness between the second electrode 12 and the conductive film 55f may be further provided between the second electrode 12 and the conductive film 55f. This metal film is made of e.g. a material including Ti, Pt, and Au.

Figure 14D:
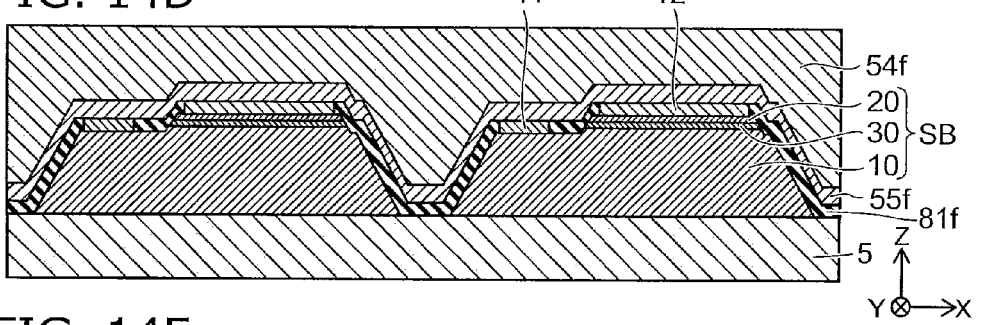

As shown in FIG. 14D, for instance, by plating processing, a conductive film 54f constituting a first layer 54 of the first metal layer 51 and a third layer 56 of the second metal layer 52 is formed on each of the plurality of stacked bodies SB.

Figure 14E:
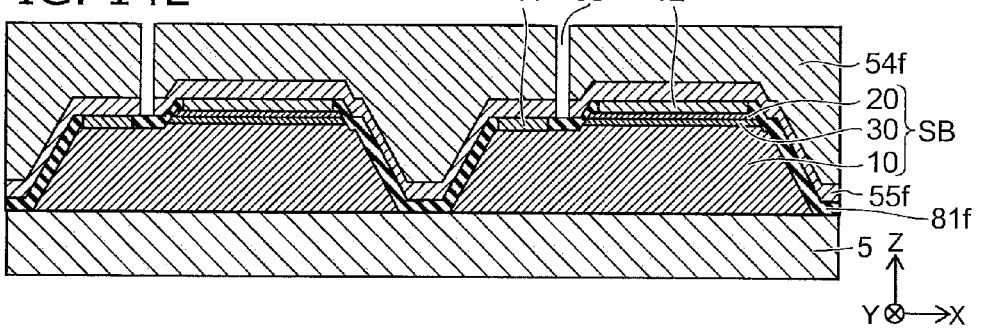

As shown in FIG. 14E, a plurality of trenches 95 for separation between the first metal layer 51 and the second metal layer 52 is formed in the conductive film 54f and the conductive film 55f by e.g. etching processing.

As shown in FIGS. 15A and 15B, for instance, by at least one of grinding processing and etching processing, the substrate 5 is removed.

As shown in FIG. 15C, for instance, by etching processing, part of the first semiconductor layer 10 is removed. Thus, the first semiconductor layer 10 is thinned, and a recess 91 and unevenness 10v are formed.

As shown in FIG. 15D, by fitting a wavelength conversion material 92 into the recess 91, a wavelength conversion layer 40 is formed. Subsequently, the plurality of stacked bodies SB are singulated. Thus, the semiconductor light emitting device 120 according to this embodiment is completed. Here, the wavelength conversion material 92 (wavelength conversion layer 40) may be fitted after singulation. In this example, the semiconductor light emitting device 120 is formed by using the workpiece 120w in which the thickness of the first semiconductor film 10f is thicker than the thickness of the first semiconductor layer 10. The example is not limited thereto. For instance, like the example shown in FIGS. 6A to 6D, 7A to 7D, 8A to 8D, and 9A to 9C, the semiconductor light emitting device 120 may be formed by the method of forming a trench 94 removing part of the substrate 5.

(Third Embodiment)

Figure 16:
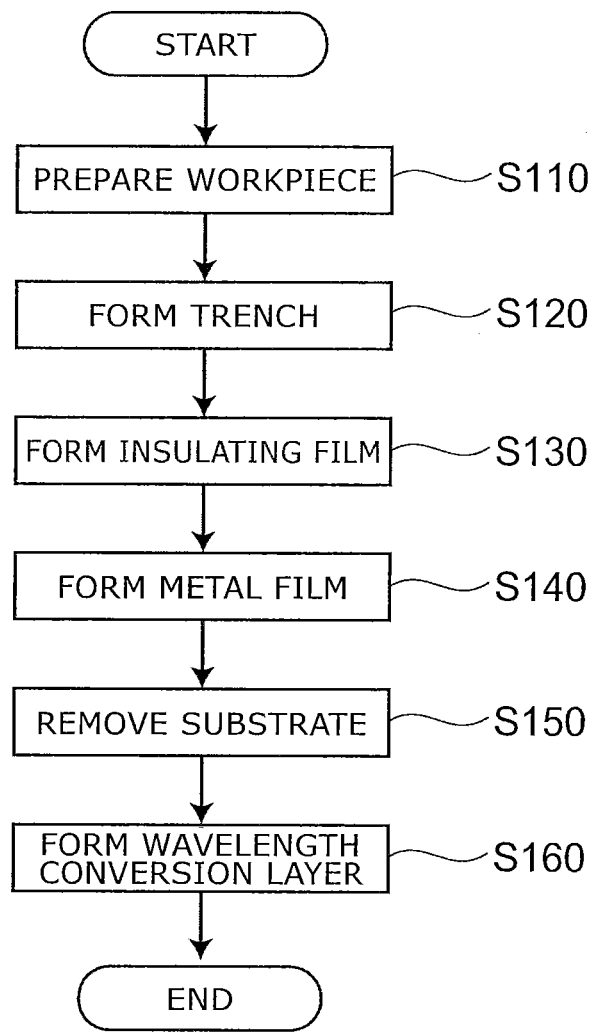
FIG. 16 is a flow chart illustrating a method for manufacturing a semiconductor light emitting device according to a third embodiment.

FIG. 16 is a flow chart illustrating a method for manufacturing a semiconductor light emitting device according to a third embodiment.

As shown in FIG. 16, the method for manufacturing a semiconductor light emitting device according to the embodiment includes the step S110 of preparing a workpiece 110w, the step S120 of forming a trench 90, the step S130 of forming a second insulating film 82f, the step S140 of forming a metal film 50f, the step S150 of removing the substrate 5 to expose the stacked body SB, and the step S160 of forming a wavelength conversion layer 40.

Thus, a semiconductor light emitting 110 having good heat dissipation is manufactured.

In the step S110, for instance, the processing described with reference to FIG. 2A is performed. In the step S120, for instance, the processing described with reference to FIG. 2C is performed. In the step S130, for instance, the processing described with reference to FIG. 2D is performed. In the step S140, for instance, the processing described with reference to FIG. 4B is performed. In the step S150, for instance, the processing described with reference to FIGS. 4C and 4D is performed. In the step S160, for instance, the processing described with reference to FIG. 5C is performed.

The embodiments provide a semiconductor light emitting having good heat dissipation and a method for manufacturing the same. The semiconductor light emitting according to the embodiments can be applied to wafer level packaging technique, and is effective for cost reduction.

In this specification, the "nitride semiconductor" includes semiconductors of the chemical formula $B_xIn_yAl_zGa_{1-x-y-z}N$ ($0 \leq x \leq 1$, $0 \leq y \leq 1$, $0 \leq z \leq 1$, $x+y+z \leq 1$) of any compositions with the composition ratios x, y, and z varied in the respective ranges. Furthermore, the "nitride semiconductor" also includes those of the above chemical formula further containing group V elements other than N (nitrogen), those further containing various elements added to control various material properties such as conductivity type, and those further containing various unintended elements.

In this specification, the state of being "provided on" includes not only the state of being provided in direct contact, but also the state of being provided with another element interposed in between. The state of being "stacked" includes not only the state of being stacked in contact with each other, but also the state of being stacked with another element interposed in between. The state of being "opposed" includes not only the state of directly facing, but also indirectly facing with another element interposed in between.

The embodiments of the invention have been described above with reference to examples. However, the embodiments of the invention are not limited to these examples. For instance, any specific configurations of various components such as the first semiconductor layer, second semiconductor layer, third semiconductor layer, first light emitting layer, second light emitting layer, stacked body, wavelength conversion layer, first metal layer, second metal layer, first electrode, second electrode, third electrode, first insulating section, wiring layer, insulating layer, unevenness, substrate, stacked film, first semiconductor film, second semiconductor film, light emitting film, workpiece, trench, insulating film, metal material, and metal film included in the semiconductor light emitting device and the method for manufacturing the same are encompassed within the scope of the invention as long as those skilled in the art can similarly practice the invention and achieve similar effects by suitably selecting such configurations from conventionally known ones.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A semiconductor light emitting device comprising:
   a stacked body including:
      a first semiconductor layer of a first conductivity type,
      a second semiconductor layer of a second conductivity type, the second semiconductor layer being separated from the first semiconductor layer in a first direction, and
      a first light emitting layer provided between the first semiconductor layer and the second semiconductor layer,
   the first semiconductor layer having a first side surface, the first side surface being non-parallel to a plane perpendicular to the first direction;
   a wavelength conversion layer configured to convert a wavelength of a light emitted from the first light emitting layer, the first semiconductor layer being disposed between the first light emitting layer and the wavelength conversion layer;
   a first metal layer including:
      a first side surface portion overlapping the first side surface in a second direction, the first side surface portion further overlapping at least a part of the wavelength conversion layer in the second direction, the second direction being perpendicular to the first direction, and
      a first bottom surface portion overlapping the second semiconductor layer in the first direction,
   the first metal layer being electrically connected to the second semiconductor layer;
   a first insulating section provided at a first position between the first side surface and the first side surface portion and at a second position between the wavelength conversion layer and the first side surface portion in the second direction, the first insulating section insulating the first semiconductor layer from the first metal layer;
   a first electrode;
   a second insulating section; and
   a third electrode,
   the first semiconductor layer having a first portion and a second portion, the first portion overlapping the first light emitting layer in the first direction, the second portion being arranged with the first portion in the second direction, the second portion not overlapping the first light emitting layer in the first direction,
   the second portion having a second side surface non-parallel to the plane,
   the first metal layer further including:
      a second side surface portion overlapping the second side surface and at least a part of the wavelength conversion layer in the second direction, and
      a second bottom surface portion overlapping the second portion in the first direction, the second bottom surface portion being continuous with the first bottom surface portion,
   the second insulating section provided between the second side surface and the second side surface portion and between the wavelength conversion layer and the second side surface portion in the second direction, and the second insulating section insulating the first semiconductor layer from the first metal layer; and
   the first electrode provided between the second portion and the second bottom surface portion and electrically connected with the first semiconductor layer,
   the second insulating section including:
      a wiring layer electrically connected with the first electrode, the wiring layer being provided between the second side surface portion and the wavelength conversion layer in the second direction,
      a first insulating layer provided between the wiring layer and the second side surface portion, the first insulating layer insulating the wiring layer from the first metal layer, and
      a second insulating layer provided between the first semiconductor layer and the wiring layer and between the wavelength conversion layer and the wiring layer,
   the first metal layer further including a second end portion, the second side surface portion being placed between the second bottom surface portion and the second end portion, the third electrode overlapping the second end portion in the first direction, the wiring layer being electrically connected with the third electrode, and the first insulating layer extending between the second end portion and the wiring layer.

2. The device according to claim 1, wherein a first distance between the first side surface and the first side surface portion is 10 μm or less, and a second distance between the wavelength conversion layer and the first side surface portion is 10 μm or less.

3. The device according to claim 1, wherein a first distance between the first side surface and the first side surface portion is less than or equal to a thickness in the first direction of the stacked body, and a second distance between the wavelength conversion layer and the first side surface portion is less than or equal to the thickness in the first direction of the stacked body.

4. The device according to claim 1, wherein the first insulating section is in contact with the first metal layer, the first side surface, and the wavelength conversion layer.

5. The device according to claim 1, wherein the first metal layer further includes a first end portion, the first side surface portion being placed between the first bottom surface portion and the first end portion, the first end portion is separated from the first bottom surface portion when projected onto the plane, the first side surface portion has an opposed surface opposing the first side surface, and the opposed surface is inclined with respect to the first direction.

6. The device according to claim 5, wherein an angle between the opposed surface and the plane is 10° or more and 60° or less.

7. The device according to claim 1, further comprising:

a second electrode provided between the second semiconductor layer and the first bottom surface portion, and the second electrode is electrically connected with the second semiconductor layer and the first metal layer.

8. The device according to claim 7, wherein the second electrode includes Ag.

9. A semiconductor light emitting device comprising:

a stacked body including:

a first semiconductor layer of a first conductivity type, a second semiconductor layer of a second conductivity type, the second semiconductor layer being separated from the first semiconductor layer in a first direction, and a first light emitting layer provided between the first semiconductor layer and the second semiconductor layer, the first semiconductor layer having a first side surface, the first side surface being non-parallel to a plane perpendicular to the first direction;

a wavelength conversion layer configured to convert a wavelength of a light emitted from the first light emitting layer, the first semiconductor layer being disposed between the first light emitting layer and the wavelength conversion layer;

a first metal layer including:

a first side surface portion overlapping the first side surface in a second direction, the first side surface portion further overlapping at least a part of the wavelength conversion layer in the second direction, the second direction being perpendicular to the first direction, and a first bottom surface portion overlapping the second semiconductor layer in the first direction, the first metal layer being electrically connected to the second semiconductor layer;

a first insulating section provided at a first position between the first side surface and the first side surface portion and at a second position between the wavelength conversion layer and the first side surface portion in the second direction, the first insulating section insulating the first semiconductor layer from the first metal layer;

a first electrode;

a second insulating section; and a third insulating section, the first semiconductor layer having a first portion and a second portion, the first portion overlapping the first light emitting layer in the first direction, the second portion being arranged with the first portion in the second direction, the second portion not overlapping the first light emitting layer in the first direction, the second portion having a second side surface non-parallel to the plane, the first metal layer further including:

a second side surface portion overlapping the second side surface and at least a part of the wavelength conversion layer in the second direction, and a second bottom surface portion overlapping the second portion in the first direction, the second bottom surface portion being continuous with the first bottom surface portion, the second insulating section being provided between the second side surface and the second side surface portion and between the wavelength conversion layer and the second side surface portion, the second insulating section insulating the first semiconductor layer from the first metal layer, the first electrode being provided between the second portion and the second bottom surface portion and electrically connected with the first semiconductor layer, the stacked body further including:

a third semiconductor layer of the second conductivity type separated from the first semiconductor layer in the first direction and separated from the second semiconductor layer in a third direction, the third direction being non-parallel to the first direction, and a second light emitting layer provided between the first semiconductor layer and the third semiconductor layer, the first semiconductor layer having:

a third portion arranged with the first portion in the third direction, the third portion overlapping the second light emitting layer in the first direction, and a fourth portion provided between the first portion and the third portion in the third direction, the fourth portion not overlapping the first light emitting layer and the second light emitting layer in the first direction, the third portion having a third side surface non-parallel to the plane; the first metal layer further including:

a third side surface portion overlapping the third side surface in the third direction and overlapping at least a part of the wavelength conversion layer in the third direction, a third bottom surface portion overlapping the third portion in the first direction, and a fourth bottom surface portion overlapping the fourth portion in the first direction, the fourth bottom surface portion being continuous with the first bottom surface portion and the third bottom surface portion;

the third insulating section being provided between the third side surface and the third side surface portion, the third insulating section being further provided between the wavelength conversion layer and the third side surface portion, and the third insulating section insulating the first semiconductor layer from the first metal layer; and the first electrode extending between the fourth portion and the fourth bottom surface portion, the second light emitting layer being provided between the first electrode and the third insulating section in the third direction.

10. The device according to claim 1, wherein the wavelength conversion layer has a length along the second direction, the length of the wavelength conversion layer is less than or equal to a distance between the first side surface portion and the second side surface portion along the second direction.

11. The device according to claim 1, wherein the wavelength conversion layer has a length along the second direction, the length of the wavelength conversion layer is 50% or more of a distance between the first side surface portion and the second side surface portion along the second direction.

12. The device according to claim 1, wherein the first electrode includes at least one of Ti, Pt, Al, Ag, Ni, Au, and Ta.

13. The device according to claim 1, wherein the wavelength conversion layer is in contact with the first semiconductor layer.

14. The device according to claim 1, wherein the wavelength conversion layer is separated from the first semiconductor layer.

15. The device according to claim 1, wherein the first metal layer includes at least one of Ti, W, Pt, Au, Cu, Ni, Ag, Co, Sn, Pd, and Al.

16. The device according to claim 1, wherein the wavelength conversion layer is filled in a recess formed from the first insulating section and the first semiconductor layer.

17. A semiconductor light emitting device comprising:
a stacked body including:
  a first semiconductor layer of a first conductivity type,
  a second semiconductor layer of a second conductivity type, the second semiconductor layer being separated from the first semiconductor layer in a first direction, and
  a first light emitting layer provided between the first semiconductor layer and the second semiconductor layer,
the first semiconductor layer having a first side surface, the first side surface being non-parallel to a plane perpendicular to the first direction;
a wavelength conversion layer configured to convert a wavelength of a light emitted from the first light emitting layer, the first semiconductor layer being disposed between the first light emitting layer and the wavelength conversion layer;
a first metal layer including:
  a first side surface portion opposing the first side surface in a second direction, the first side surface portion further opposing at least a part of the wavelength conversion layer, the second direction being perpendicular to the first direction, and
  a first bottom surface portion opposing the second semiconductor layer,
the first metal layer being electrically connected with the second semiconductor layer;
a first insulating section provided between the first side surface and the first side surface portion and between the wavelength conversion layer and the first side surface portion in the second direction, the first insulating section insulating the first semiconductor layer from the first metal layer;
a first electrode;
a second insulating section; and
a third electrode,
the wavelength conversion layer being filled in a recess formed from the first insulating section and the first semiconductor layer,
the first semiconductor layer having a first portion and a second portion, the first portion overlapping the first light emitting layer in the first direction, the second portion being arranged with the first portion in the second direction, the second portion not overlapping the first light emitting layer in the first direction,
the second portion having a second side surface non-parallel to the plane,
the first metal layer further including:
  a second side surface portion overlapping the second side surface and at least a part of the wavelength conversion layer in the second direction, and
  a second bottom surface portion overlapping the second portion in the first direction, the second bottom surface portion being continuous with the first bottom surface portion,
the second insulating section provided between the second side surface and the second side surface portion and between the wavelength conversion layer and the second side surface portion, the second insulating section insulating the first semiconductor layer from the first metal layer; and
the first electrode provided between the second portion and the second bottom surface portion and electrically connected with the first semiconductor layer,
the second insulating section including:
  a wiring layer electrically connected with the first electrode, the wiring layer being provided between the second side surface portion and the wavelength conversion layer in the second direction,
  a first insulating layer provided between the wiring layer and the second side surface portion, the first insulating layer insulating the wiring layer from the first metal layer, and
  a second insulating layer provided between the first semiconductor layer and the wiring layer and between the wavelength conversion layer and the wiring layer,
the first metal layer further including a second end portion, the second side surface portion being placed between the second bottom surface portion and the second end portion,
the third electrode overlapping the second end portion in the first direction,
the wiring layer being electrically connected with the third electrode, and
the first insulating layer extending between the second end portion and the wiring layer.

18. The device according to claim 1, wherein the wavelength conversion layer includes phosphors.

19. The device according to claim 9, wherein the wavelength conversion layer has a length along the second direction, the length of the wavelength conversion layer is less than or equal to a distance between the first side surface portion and the second side surface portion along the second direction.

20. The device according to claim 9, wherein the wavelength conversion layer has a length along the second direction, the length of the wavelength conversion layer is 50% or more of a distance between the first side surface portion and the second side surface portion along the second direction.

21. The device according to claim 9, wherein the first electrode includes at least one of Ti, Pt, Al, Ag, Ni, Au, and Ta.

* * * * *